(12) United States Patent
Koide et al.

(10) Patent No.: US 10,790,316 B2
(45) Date of Patent: Sep. 29, 2020

(54) DISPLAY DEVICE

(71) Applicant: Japan Display Inc., Minato-ku (JP)

(72) Inventors: Gen Koide, Tokyo (JP); Masaki Murase, Tokyo (JP); Nobuyuki Ishige, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/783,659

(22) Filed: Feb. 6, 2020

(65) Prior Publication Data

US 2020/0176488 A1 Jun. 4, 2020

Related U.S. Application Data

(63) Continuation of application No. 16/367,531, filed on Mar. 28, 2019, now Pat. No. 10,600,822, which is a continuation of application No. 16/040,141, filed on Jul. 19, 2018, now Pat. No. 10,297,621, which is a continuation of application No. 15/901,918, filed on
(Continued)

(30) Foreign Application Priority Data

Apr. 8, 2015 (JP) .................. 2015-079124

(51) Int. Cl.
| | | |
|---|---|---|
| H01L 27/12 | (2006.01) |
| H01L 27/32 | (2006.01) |
| G02F 1/1362 | (2006.01) |
| G02F 1/1368 | (2006.01) |

(52) U.S. Cl.
CPC ........ H01L 27/1244 (2013.01); G02F 1/1368 (2013.01); G02F 1/136286 (2013.01); H01L 27/124 (2013.01); H01L 27/3276 (2013.01); H01L 27/3279 (2013.01); G02F 2001/13629 (2013.01)

(58) Field of Classification Search
None
See application file for complete search history.

(56) References Cited

U.S. PATENT DOCUMENTS 7,796,230 B2   9/2010   Jeong et al.
7,944,538 B2   5/2011   Ishige et al.
(Continued)

FOREIGN PATENT DOCUMENTS

JP     9-311341     12/1997
JP     2014-53702    2/2004
(Continued)

OTHER PUBLICATIONS

Office Action dated Nov. 20, 2018 in Japanese Patent Application No. 2015-079124.
(Continued)

*Primary Examiner* — Cheung Lee
(74) *Attorney, Agent, or Firm* — Oblon, McClelland, Maier & Neustadt, L.L.P.

(57) ABSTRACT

In a transistor substrate of a display device, a plurality of signal lines to which any one of drive signals of a gate signal and a video signal is supplied include a plurality of first signal lines to which the drive signal is supplied. The first signal line is connected to a driving driver, and is formed in an edge region positioned between an end portion of a substrate and a pixel region and in the pixel region. The first signal line is formed to pass through a first wiring formed in a first layer from a second wiring formed in a second layer in the edge region.

12 Claims, 15 Drawing Sheets

Related U.S. Application Data

Feb. 22, 2018, now Pat. No. 10,050,064, which is a continuation of application No. 15/353,139, filed on Nov. 16, 2016, now Pat. No. 9,935,134, which is a continuation of application No. 15/081,224, filed on Mar. 25, 2016, now Pat. No. 9,536,910.

(56) References Cited

U.S. PATENT DOCUMENTS

| | | |
|---|---|---|
| 7,990,511 B2 | 8/2011 | Jeong et al. |
| 9,078,363 B2 | 7/2015 | Mori |
| 9,244,316 B2 | 1/2016 | Nishino et al. |
| 9,690,149 B2 | 6/2017 | Fujikawa |
| 9,870,744 B2 | 1/2018 | Fujikawa |
| 9,875,699 B2 | 1/2018 | Fujikawa |
| 9,964,818 B2 | 5/2018 | Fujikawa |
| 10,083,667 B2 | 9/2018 | Fujikawa |
| 2008/0143945 A1 | 6/2008 | Jeong |
| 2012/0105392 A1 | 5/2012 | Nagami |

FOREIGN PATENT DOCUMENTS

| | | |
|---|---|---|
| JP | 2008-003118 | 1/2008 |
| JP | 2008-118054 | 5/2008 |
| JP | 2008-152261 | 7/2008 |
| JP | 2011-123162 | 6/2011 |
| JP | 2012-98464 | 5/2012 |
| JP | 2013-61389 | 4/2013 |
| JP | 2013-246229 A | 12/2013 |
| WO | WO 2011/061961 A1 | 5/2011 |
| WO | WO 2014/112560 A1 | 7/2014 |
| WO | WO 2014/132799 A1 | 9/2014 |
| WO | WO 2015/033840 A1 | 3/2015 |

OTHER PUBLICATIONS

Office Action dated Mar. 12, 2019 in corresponding Japanese Patent Application No. 2015-079124 with English Translation.

DISPLAY DEVICE

CROSS-REFERENCE TO RELATED APPLICATIONS

The application is a continuation of U.S. application Ser. No. 16/367,531 filed Mar. 28, 2019, which is a continuation of U.S. application Ser. No. 16/040,141, filed Jul. 19, 2018, which is a continuation of U.S. application Ser. No. 15/901,918, filed Feb. 22, 2018, which is a continuation of U.S. application Ser. No. 15/353,139, filed Nov. 16, 2016 (now U.S. Pat. No. 9,935,134, issued Apr. 3, 2018), which is a continuation of application Ser. No. 15/081,224, filed Mar. 25, 2016 (now U.S. Pat. No. 9,536,910, issued Jan. 3, 2017), which claims priority from Japanese Patent Application No. 2015-079124, filed on Apr. 8, 2015, the contents of each of which are hereby incorporated by reference into this application.

TECHNICAL FIELD OF THE INVENTION

The present invention relates to a transistor substrate and a display device, and relates to, for example, a technique effectively applied to a display device which has a plurality of lead-out wirings to transmit a signal to a plurality of display elements formed in a display region.

BACKGROUND OF THE INVENTION

A display device includes, for example, a plurality of display elements such as transistors formed in a display region. An image is displayed in such a display device by transmitting a signal to the plurality of display elements to drive the display elements. A large number of signal lines are required to transmit the signal to the plurality of display elements. The number of signal lines increases a definition of a display image become higher.

In addition, a technique of reducing the area of a part called a peripheral region or a frame region, which is non-display part surrounding the perimeter of the display region, has been requested for the display device. A lead-out line which is connected to the signal line and supplies a signal to the signal line is formed in the frame region. In other words, it is necessary to efficiently lay out a large number of the lead-out lines in the frame region in order to improve the performance of the display device.

For this purpose, a technique of efficiently laying out the large number of lead-out lines in a frame region by distributing the large number of lead-out lines to a plurality of wiring layers laminated with an insulating film interposed therebetween has been known. For example, Japanese Patent Application Laid-Open Publication No. 2004-53702 (Patent Document 1) describes a technique of forming a plurality of gate connecting lines, which are connected to a plurality of gate lines formed in a pixel region, in a plurality of wiring layers. In addition, Japanese Patent Application Laid-Open Publication No. 2011-123162 (Patent Document 2) describes a technique of forming wirings, which are connected to a thin-film transistor for inspection, in a plurality of wiring layers.

SUMMARY OF THE INVENTION

The inventors of the present application have conducted a study regarding the above-described technique of distributing the large number of lead-out lines to the plurality of wiring layers laminated with the insulating film interposed therebetween, and have found out the following problems. Note that the lead-out line is connected to the signal line in the display region and can be considered as apart of the signal line, and thus, the lead-out line will be referred to also as the signal line.

For example, the following problems occur in the case of laying out a large number of signal lines in the evenly distributed manner in a plurality of (generally, two) wiring layers. A wiring to be formed in each of the wiring layers is restricted in terms of a wiring material, a wiring thickness, a wiring width and a distance between wirings because of a reason on a manufacturing process, and thus, there is a problem that parasitic resistance increases in the signal line using a wiring layer having a high resistance value. Further, there is also a problem that a capacitance of the signal line increases because a capacitance between the wiring layers is added. In addition, there is also a problem that streaks are generated when a resistance difference occurs for each of the signal lines due to the resistance difference among the wiring layers. Since these problems affect the performance of the display device, the improvement is necessary.

An object of the present invention is to provide a technique to efficiently lay out a plurality of wirings in a frame region of a display device while suppressing influence on performance of the display device.

A transistor substrate according to an aspect of the present invention includes: a substrate; a pixel region which has a transistor and in which a pixel to display an image is formed; an edge region which is positioned between an end portion of the substrate and the pixel region; a plurality of signal lines to which any one of drive signals of a gate signal and a video signal is supplied; an insulating film which covers the signal lines; a driving driver which is provided in the edge region and supplies at least the drive signal; a first wiring which is formed in a first layer; and a second wiring which is formed in a second layer as a different layer from the first layer with the insulating film interposed therebetween. The plurality of signal lines include a plurality of first signal lines to which the drive signal is supplied, the first signal line is connected to the driving driver and is formed in the edge region and the pixel region, and the first signal line is formed to pass through the first wiring from the second wiring in the edge region.

In addition, as another aspect, in a display device provided with the transistor substrate, a UV-curable resin is formed in the edge region, the substrate is optically transparent, and the signal lines may be formed so that a gap through which the UV-curable resin can be irradiated with ultraviolet light through the substrate can be created in an overlapping region in which a region in which the signal line is formed and a region in which the UV-curable resin is formed overlap each other.

DESCRIPTIONS OF THE PREFERRED EMBODIMENTS

Figure 1:
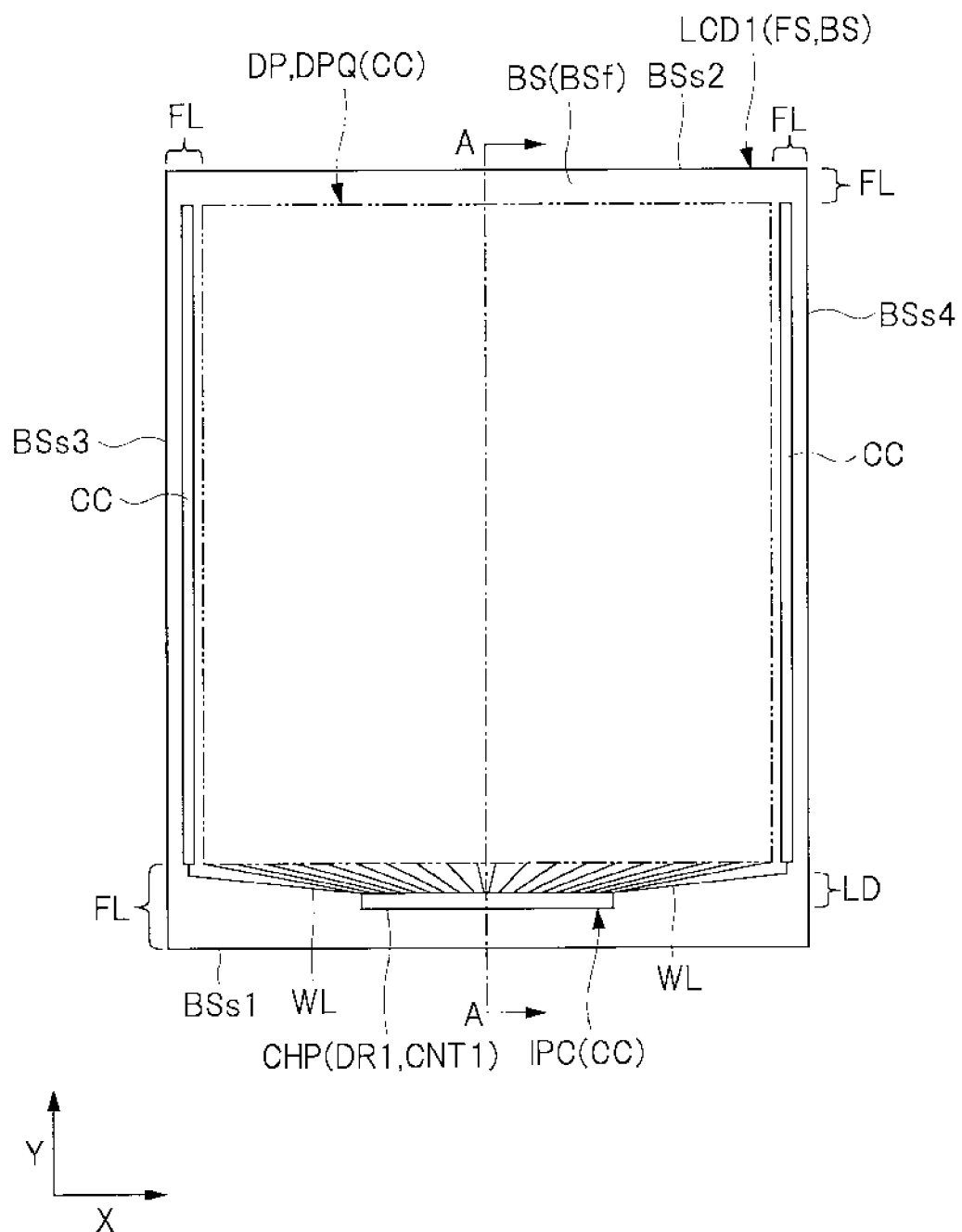
FIG. 1 is a plan view illustrating an example of a display device according to an embodiment.

Hereinafter, each embodiment of the present invention will be described with reference to the drawings. Note that the disclosure is mere an example, and it is a matter of course that any alteration that is easily conceivable by a person skilled in the art while keeping a gist of the present invention is included in the present invention. In addition, the drawings schematically illustrate a width, a thickness, a shape and the like of each portion as compared to actual aspects in order to make the description clearer, but the drawings are mere examples and do not limit the interpretation of the present invention.

In addition, the same or relevant reference characters are applied to the same elements as those described in relation to the foregoing drawings in the present specification and the respective drawings, and detailed descriptions thereof will be appropriately omitted in some cases.

Embodiment

A technique described in the present embodiment can be widely applied to a display device having a configuration in which a signal is supplied from the perimeter of a display region to a plurality of elements in the display region in which a display element layer is provided. Note that the display element layer may have any structure as long as it is possible to control the output of light. Examples of the display element layer include liquid crystal molecules, an organic electro-luminescence (EL) and a micro electro mechanical system (MEMS) shutter. A liquid crystal display device will be described as a representative example of the display element layer and the display device in the present embodiment.

In addition, the liquid crystal display device is roughly classified into the following two modes depending on an application direction of an electric field for changing alignment of liquid crystal molecules of a liquid crystal layer serving as the display element layer. That is, there is a so-called vertical electric field mode as a first classification, in which the electric field is applied in a thickness direction (or out-of-plane direction) of the display device. The vertical electric field mode includes, for example, a twisted nematic (TN) mode, a vertical alignment (VA) mode and the like. In addition, there is a so-called horizontal electric field mode as a second classification, in which the electric field is applied in a planar direction (or in-plane direction) of the display device. The horizontal electric field mode includes, for example, an in-plane switching (IPS) mode, a fringe field switching (FFS) mode which is one of the IPS modes and the like. The technique to be described hereinafter can be applied to any one of the vertical electric field mode and the horizontal electric field mode, but a display device of the horizontal electric field mode will be described as an example in the present embodiment.

Basic Configuration of Display Device

Figure 2:
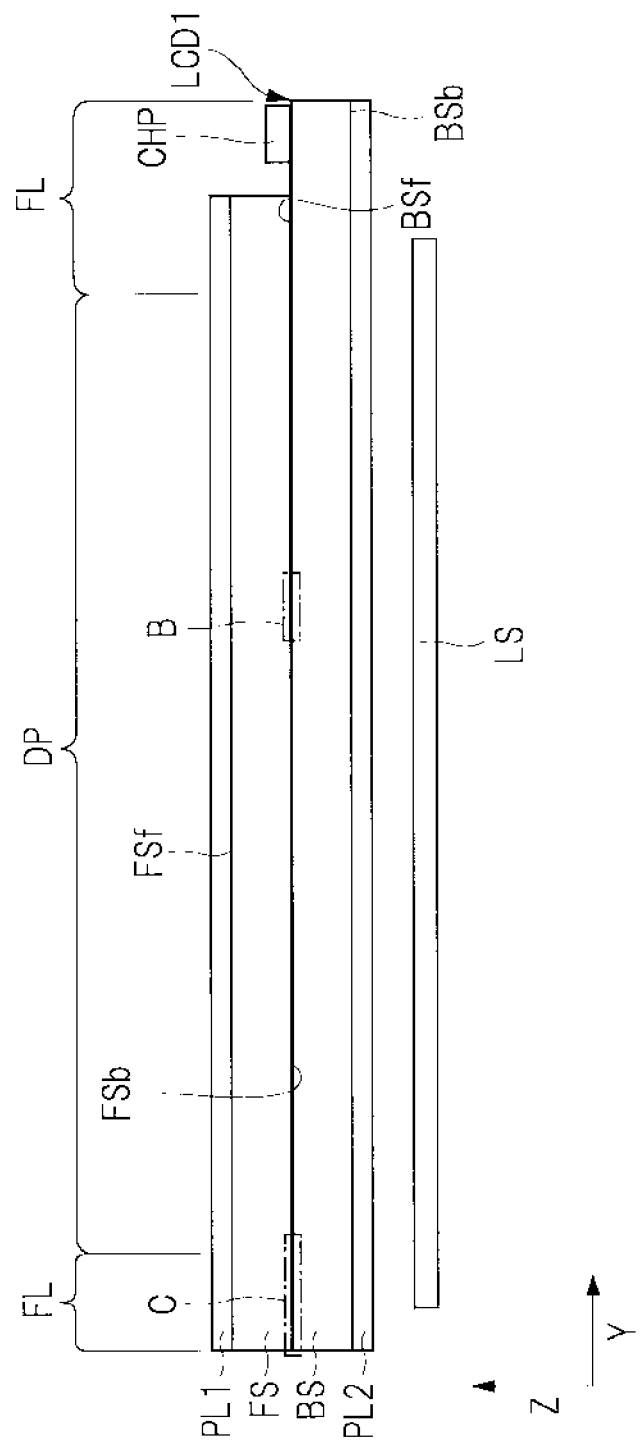
FIG. 2 is a cross-sectional view taken along a line A-A of FIG. 1.
Figure 3:
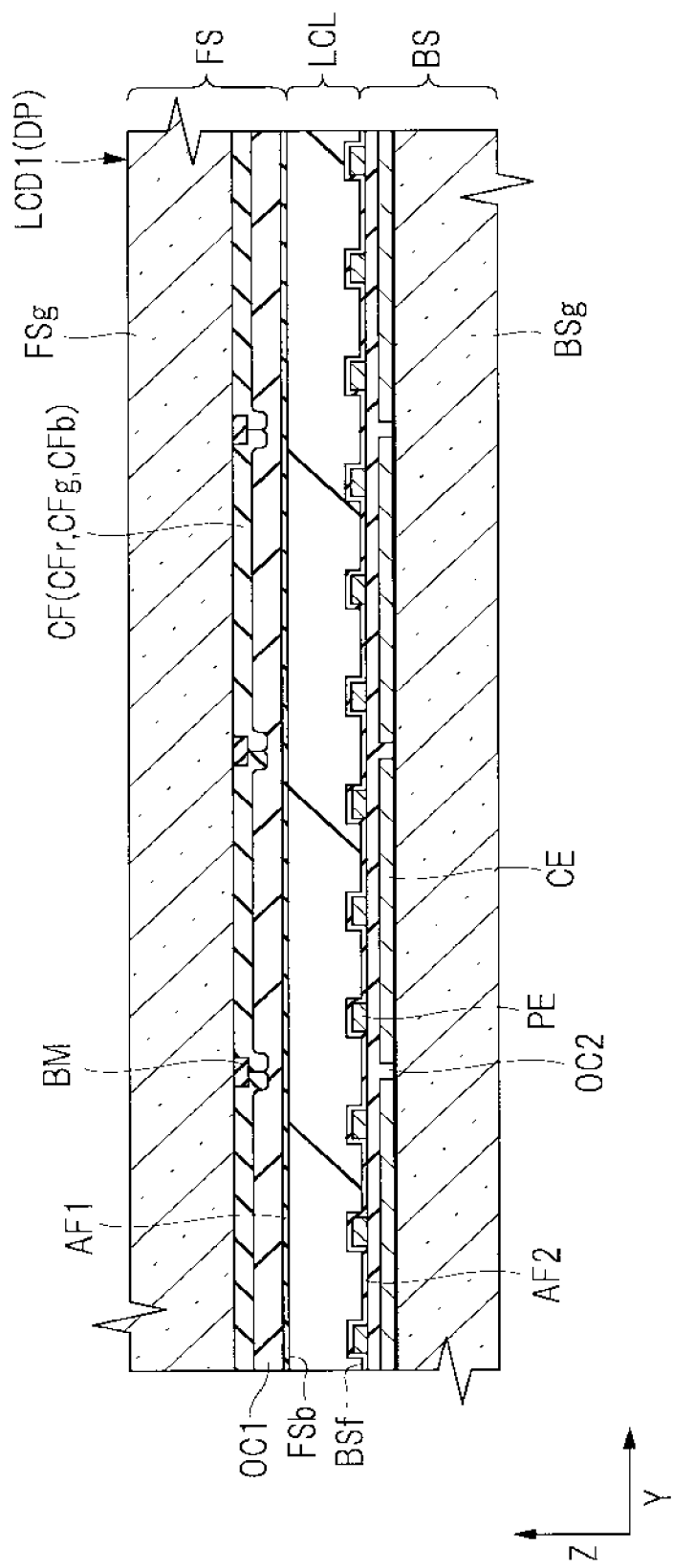
FIG. 3 is an enlarged cross-sectional view of a section B of FIG. 2.
Figure 4:
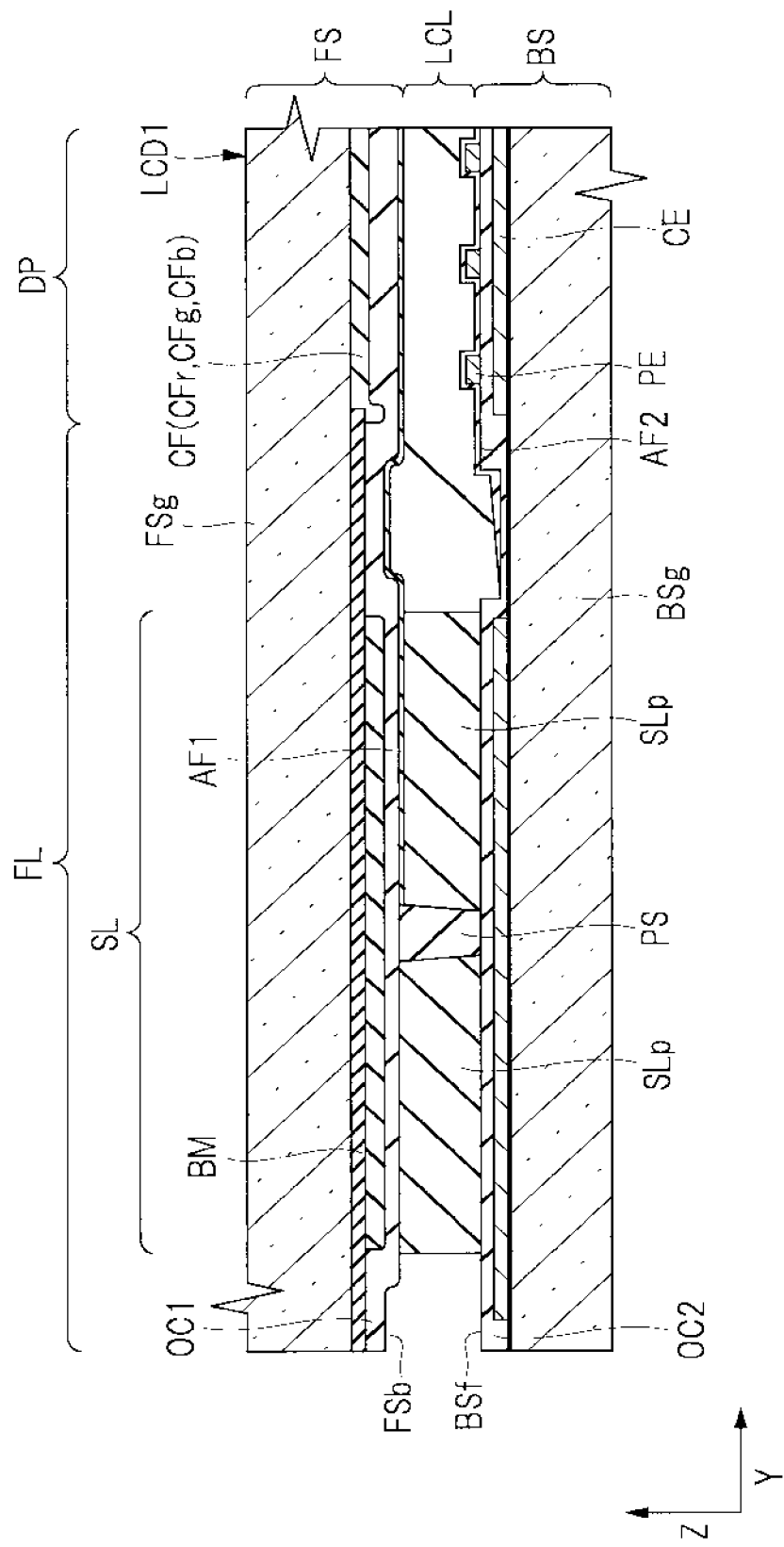
FIG. 4 is an enlarged cross-sectional view of a section C of FIG. 2.

First, a basic configuration of a display device will be described. FIG. 1 is a plan view illustrating an example of a display device of the present embodiment. FIG. 2 is a cross-sectional view taken along a line A-A of FIG. 1. FIG. 3 is an enlarged cross-sectional view of a section B of FIG. 2. FIG. 4 is an enlarged cross-sectional view of a section C of FIG. 2.

Note that FIG. 1 illustrates a contour of a display section DP by a two-dot chain line in order to make a boundary between the display section DP and a frame section FL in a plan view easy to see. In addition, a plurality of wirings WL illustrated in FIG. 1 extend from a peripheral region of the display section DP to a region overlapping the display section DP. In addition, although FIG. 2 is a cross-sectional view, the hatching is omitted for the viewability.

As illustrated in FIG. 1, a display device LCD1 of the present embodiment includes the display section DP which is a display region in which an image that is viewable from the outside is formed in accordance with an input signal. This display section DP is referred to also as a pixel region in which pixels to display the image are formed. In addition, the display device LCD1 includes the frame section FL which is a non-display region provided in a frame shape around the display section DP when seen in a plan view. This frame section FL is referred to also as an edge region which is positioned between an end portion of a substrate and the display section DP.

Although the display region of this display device has a rectangular shape, the display region may have a polygonal shape or a circular shape. In addition, the display region may be formed to extend to a vicinity of an end portion of the display device. In this case, a peripheral region of the display region is not formed in a frame shape, but is referred to as the frame section even in this case.

In addition, the display device LCD1 has a structure in which a liquid crystal layer serving as a display element layer is formed between a pair of substrates which are arranged opposite to each other. Namely, as illustrated in FIG. 2, the display device LCD1 includes a substrate FS on a display surface side, a substrate BS positioned on the opposite side of the substrate FS, and a liquid crystal layer LCL (see FIG. 3) arranged between the substrate FS and the substrate BS.

In addition, the substrate BS illustrated in FIG. 1 includes a side BSs1 extending along an X direction, a side BSs2 opposed to the side BSs1, a side BSs3 extending along a Y direction orthogonal to the X direction, and a side BSs4 opposed to the side BSs3 when seen in a plan view. Each distance from the side BSs2, the side BSs3 and the side BSs4 included in the substrate BS illustrated in FIG. 1 to the display section DP is substantially equal and is shorter than a distance from the side BSs1 to the display section DP. Hereinafter, when a peripheral edge portion of the substrate BS is mentioned in the present application, it indicates any one of the side BSs1, the side BSs2, the side BSs3 and the side BSs4 constituting an outer edge of the substrate BS. In addition, when a peripheral edge portion is simply mentioned, it indicates the peripheral edge portion of the substrate BS.

In addition, the liquid crystal layer LCL provided in the display section DP illustrated in FIG. 1 is driven for each pixel (in detail, subpixel) in accordance with the signal to be applied to a circuit section CC.

The circuit section CC is connected to a display element section DPQ in which a plurality of display elements are arrayed at positions overlapping the display section DP. The plurality of display elements provided in the display element section DPQ are arranged in a matrix form for each pixel (in detail, subpixel), and perform the switching operation. In this embodiment, each of the plurality of display elements is a transistor called thin-film transistor (TFT) formed in the substrate.

In addition, the circuit section CC includes the plurality of wirings WL which are provided in the frame section FL in the perimeter of the display section DP and electrically connected to the plurality of display elements of the display element section DPQ. In addition, an input unit IPC, which is electrically connected to the display element section DPQ and inputs a drive signal or a video signal to the plurality of display elements of the display element section DPQ via the plurality of wirings WL, is included in the circuit section CC to drive the display element layer. In the example illustrated in FIG. 1, a semiconductor chip CHP in which a drive circuit DR1 for image display and a control circuit CNT1 are formed is mounted in the input unit IPC.

In addition, the input unit IPC is provided between the side BSs1 of the substrate BS and the display section DP in the frame section FL of the display device LCD1 in the example illustrated in FIG. 1. In addition, a lead-out wiring section LD in which the plurality of wirings WL are formed is provided between the side BSs1 of the substrate BS and the display section DP. The display element section DPQ and the input unit IPC are electrically connected via the lead-out wiring section LD. A detailed structure of the lead-out wiring section LD will be described later.

In addition, the display device LCD1 includes a seal portion formed in the frame section FL when seen in a plan view. The seal portion is formed so as to continuously surround the perimeter of the display section DP, and the substrate FS and the substrate BS illustrated in FIG. 2 are attached and fixed to each other by a seal material provided in the seal portion. In this manner, it is possible to seal the liquid crystal layer LCL (see FIG. 3) serving as the display element layer by providing the seal portion in the perimeter of the display section DP.

In addition, a polarizing plate PL2 which polarizes light generated from a light source LS is provided on a back surface BSb of the substrate BS of the display device LCD1 as illustrated in FIG. 2. The polarizing plate PL2 is fixed to the substrate BS. On the other hand, a polarizing plate PL1 is provided on a front surface FSf of the substrate FS. The polarizing plate PL1 is fixed to the substrate FS.

In addition, the display device LCD1 includes the plurality of pixel electrodes PE and common electrodes CE arranged between the substrate FS and the substrate BS as illustrated in FIG. 3. Since the display device LCD1 of this embodiment is the display device of the horizontal electric field mode as described above, the plurality of pixel electrodes PE and the common electrodes CE are respectively formed in the substrate BS.

The substrate BS illustrated in FIG. 3 includes a base material BSg made of a glass substrate or the like, and a circuit for mainly displaying an image is formed in the base material BSg. The substrate BS includes a front surface BSf positioned on the side of the substrate FS and a back surface BSb (see FIG. 2) positioned on the opposite side thereof. In addition, a display element such as a TFT and the plurality of pixel electrodes PE are formed in a matrix form on the front surface BSf of the substrate BS. Since the TFT is formed in the substrate BS, the substrate BS is referred to as a TFT substrate, a transistor substrate or the like.

Since the display device LCD1 of the horizontal electric field mode (in detail, an FFS mode) is illustrated in the example illustrated in FIG. 3, the common electrode CE is formed on the front surface side of the base material BSg provided in the substrate BS, and is covered with a resin layer OC2 serving as an insulating film. In addition, the plurality of pixel electrodes PE are formed on the substrate FS side of the resin layer OC2 so as to be opposed to the common electrode CE via the resin layer OC2. Note that an inorganic material such as silicon nitride or silicon oxide may be used as an insulating film instead of the resin layer OC2.

In addition, the substrate FS illustrated in FIG. 3 is a substrate in which a color filter CF to form an image of color display is formed in the base material FSg made of the glass substrate or the like, and includes the front surface FSf (see FIG. 2) on the display surface side and a back surface FSb positioned on the opposite side of the front surface FSf. The substrate in which the color filter CF is formed like the substrate FS is referred to as a color filter substrate or a counter substrate because it is opposed to the TFT substrate with the liquid crystal layer interposed therebetween when being distinguished from the above-described TFT substrate having the TFT formed therein. Note that a configuration in which the color filter CF is provided in the TFT substrate may be employed as a modified example with respect to FIG. 3.

The color filter CF which is configured by periodically arranging color filter pixels CFr, CFg and CFb of three colors of red (R), green (G) and blue (B) is formed on one surface of the base material FSg made of, for example, the glass substrate or the like in the substrate FS. One pixel is configured of, for example, subpixels of the three colors of red (R), green (G) and blue (B) as one set in a color display device. The plurality of color filter pixels CFr, CFg and CFb of the substrate FS and the subpixels including the pixel electrodes PE formed in the substrate BS are arranged at positions opposed to each other.

In addition, a light-shielding film BM is formed at each boundary of the color filter pixels CFr, CFg and CFb of the respective colors. The light-shielding film BM is made of, for example, black resin or metal with low reflectivity. The light-shielding film BM is generally formed in a grid shape when seen in a plan view. In this case, the substrate FS includes the color filter pixels CFr, CFg and CFb of the respective colors which are formed in opening portions of the light-shielding film BM formed in the grid shape. Note that the colors to configure the single pixel are not limited to the three colors of red (R), green (G) and blue (B). In addition, the light-shielding film BM is not limited to have the grid shape, and may have a stripe shape.

In this application, a region which is described as the display section DP or the display region is defined as a region on the inner side relative to the frame section FL. In addition, the frame section FL is the peripheral region in which the light emitted from the light source LS illustrated in FIG. 2 is shielded by the light-shielding film BM or the like. Although the light-shielding film BM is formed also in the display section DP, a plurality of opening portions are formed in the light-shielding film BM in the display section DP. In general, an end portion of the opening portion formed closest to the peripheral edge portion among the opening portions which are formed in the light-shielding film BM and in which the color filters CF are embedded is defined as the boundary between the display section DP and the frame section FL.

In addition, the substrate FS includes a resin layer OC1 that covers the color filter CF. Since the light-shielding film BM is formed at each boundary of the color filter pixels CFr, CFg and CFb of the respective colors, an inner surface of the color filter CF is formed as an uneven surface. The resin layer OC1 functions as a planarization film that planarizes the unevenness of the inner surface of the color filter CF.

In addition, the liquid crystal layer LCL which forms a display image when a display voltage is applied between the pixel electrode PE and the common electrode CE is provided between the substrate FS and the substrate BS. The liquid crystal layer LCL modulates the light passing therethrough depending on a state of the applied electric field.

In addition, the substrate FS includes an alignment film AF1 that covers the resin layer OC1 on the back surface FSb which is an interface in contact with the liquid crystal layer LCL. In addition, the substrate BS includes an alignment film AF2 that covers the resin layer OC2 and the plurality of pixel electrodes PE on the front surface BSf which is an interface in contact with the liquid crystal layer LCL. These alignment films AF1 and AF2 are resin films which are formed to align an initial alignment of liquid crystal included in the liquid crystal layer LCL, and are made of, for example, polyimide resin.

In addition, a seal portion SL provided on a peripheral edge portion side of the liquid crystal layer LCL is provided with a seal material SLp as illustrated in FIG. 4. The liquid crystal layer LCL is sealed inside a region which is surrounded by the seal material SLp. In other words, the seal material SLp has a function as a sealing material that prevents the leakage of the liquid crystal layer LCL. In addition, the seal material SLp is in close contact with each of the back surface FSb of the substrate FS and the front surface BSf of the substrate BS, and the substrate FS and the substrate BS are attached and fixed to each other via the seal material SLp. In other words, the seal material SLp has a function as an adhesion member that attaches and fixes the substrate FS and the substrate BS to each other.

In addition, the seal portion SL includes a member PS which is arranged in the perimeter of the liquid crystal layer LCL and extends along an outer edge of the liquid crystal layer LCL in the example illustrated in FIG. 4. The member PS functions as a damming member to dam the spread of the alignment film AF1. In addition, a thickness of the liquid crystal layer LCL illustrated in FIGS. 3 and 4 is extremely small as compared to a thickness of the substrate FS or the substrate BS. For example, the thickness of the liquid crystal layer LCL is a thickness of about 0.1% to 10% when compared with the thickness of the substrate FS or the substrate BS. The thickness of the liquid crystal layer LCL is, for example, about 3 $\mu m$ to 4 $\mu m$ in the examples illustrated in FIGS. 3 and 4.

Details of Lead-Out Wiring Section

Figure 5:
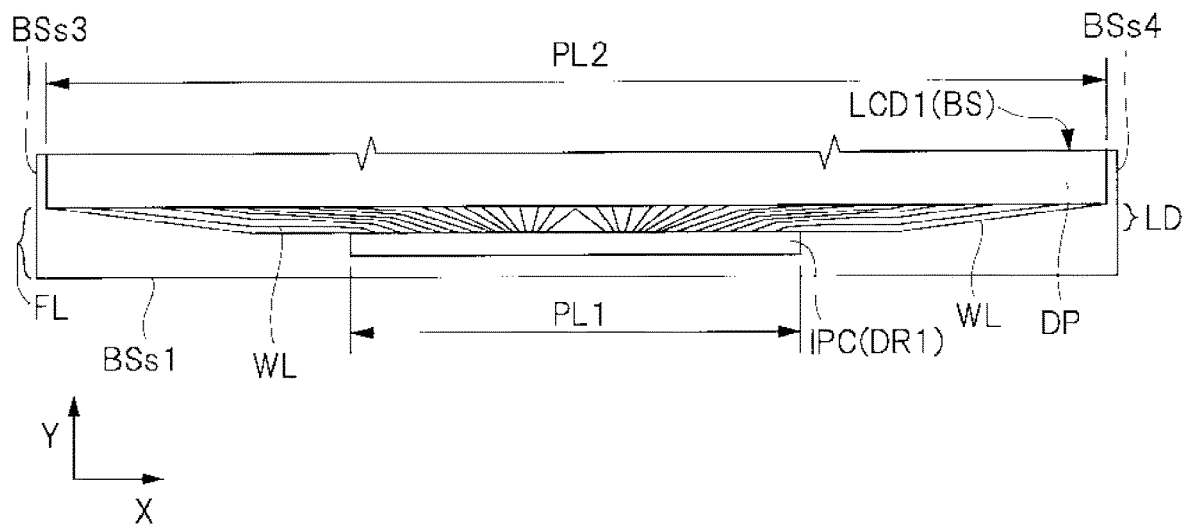
FIG. 5 is an enlarged plan view schematically illustrating layout of a lead-out wiring section illustrated in FIG. 1.
Figure 6:
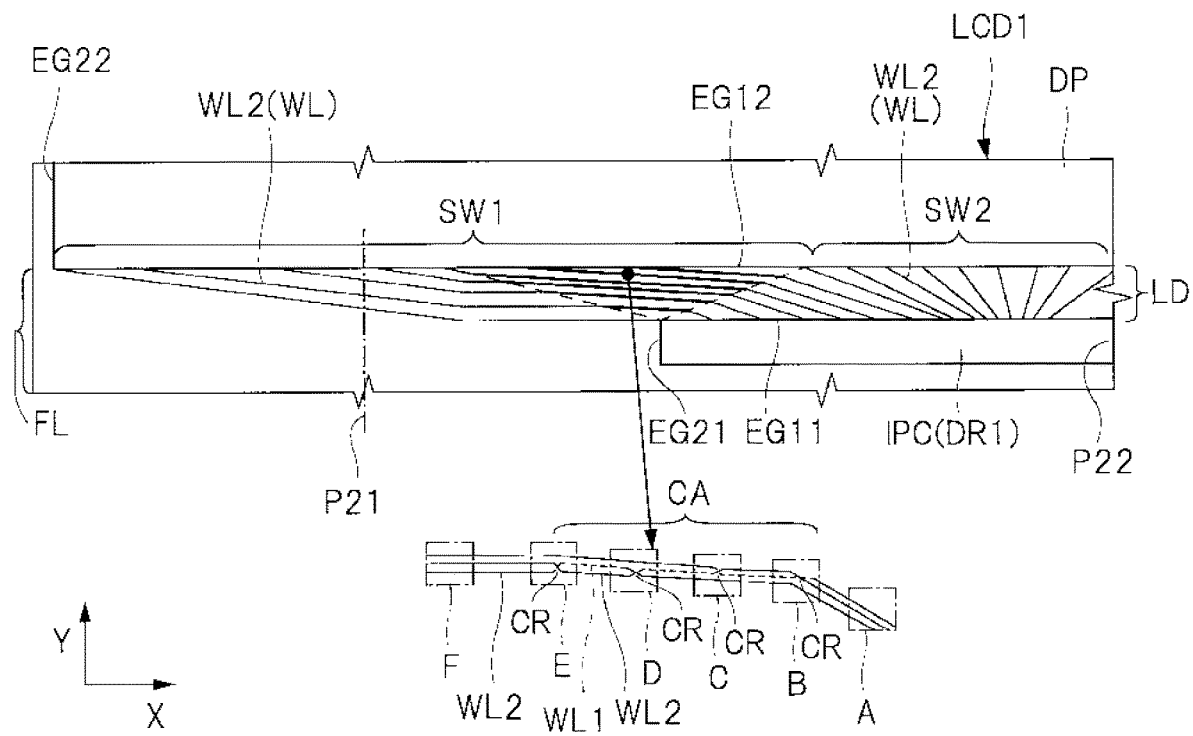
FIG. 6 is an enlarged plan view illustrating a layout example in a case in which a plurality of wirings are laid in two wiring layers in the lead-out wiring section illustrated in FIG. 5.
Figure 11:
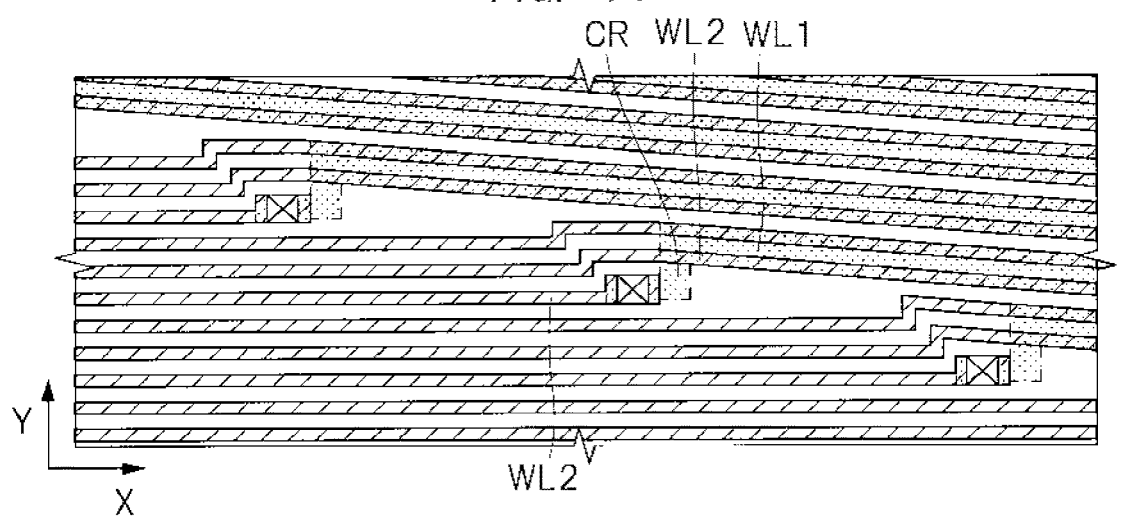
FIG. 11 is an enlarged plan view illustrating a section E of the wiring in the layout example illustrated in FIG. 6.
Figure 12:
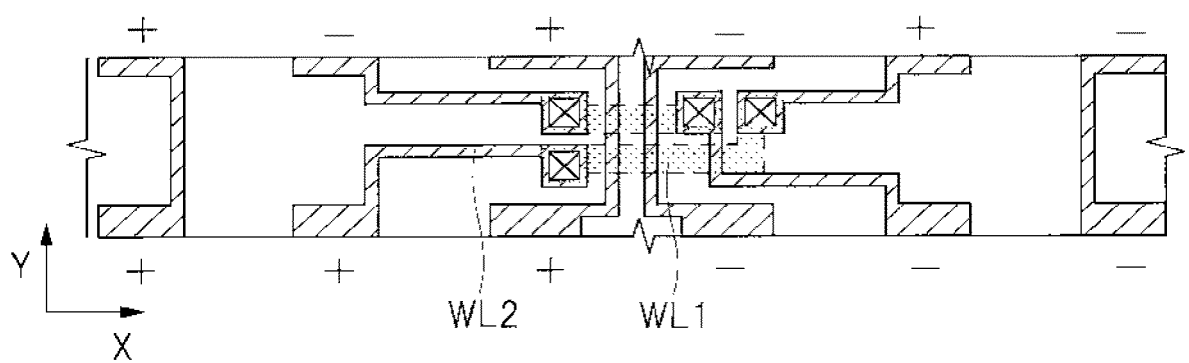
FIG. 12 is an enlarged plan view illustrating a section F of the wiring in the layout example illustrated in FIG. 6.
Figure 13:
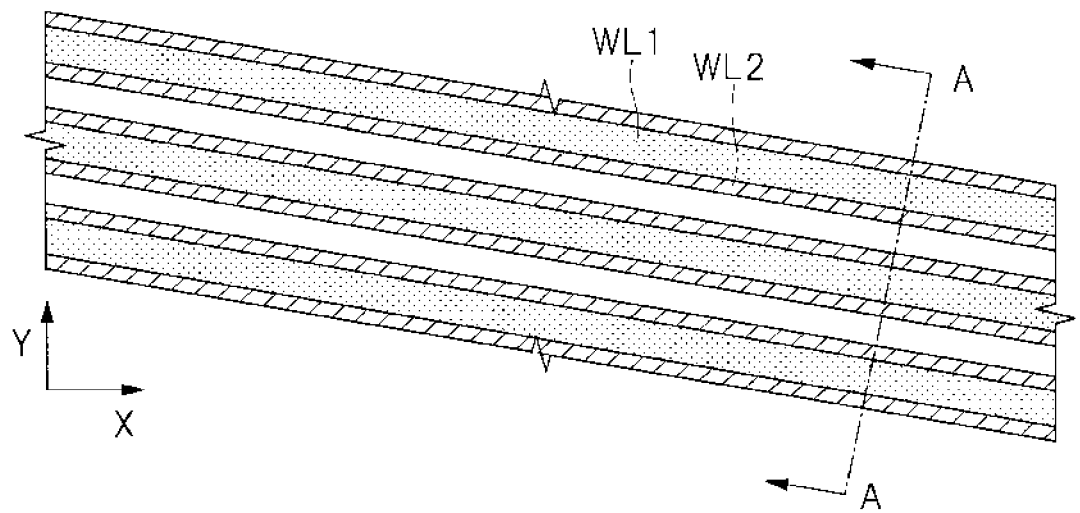
FIG. 13 is an enlarged plan view illustrating a section G of the wiring illustrated in FIG. 9 in detail.
Figure 14:
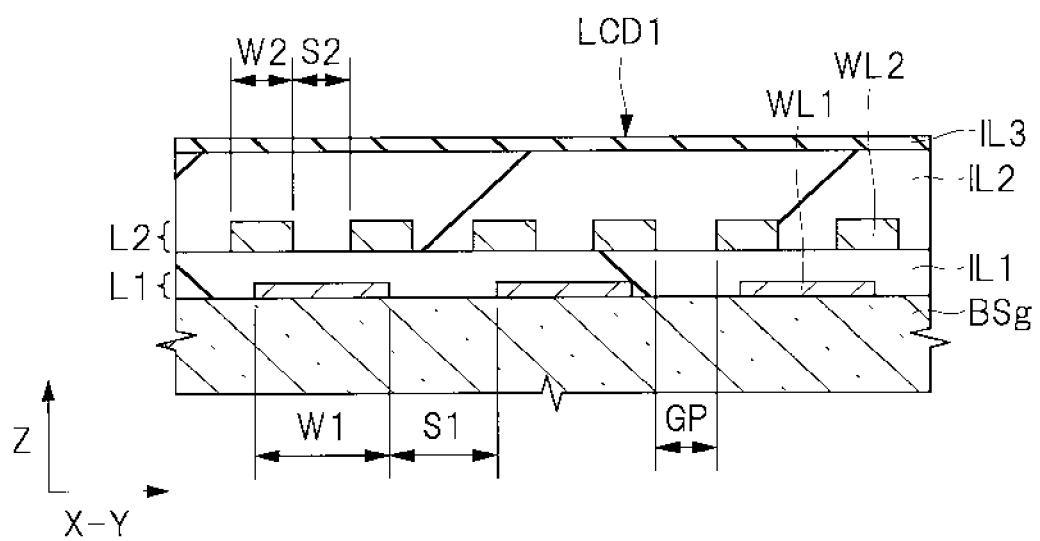
FIG. 14 is an enlarged cross-sectional view taken along a line A-A of FIG. 13.

Next, details of the lead-out wiring section LD illustrated in FIG. 1 will be described. FIG. 5 is an enlarged plan view schematically illustrating layout of the lead-out wiring section illustrated in FIG. 1. FIG. 6 is an enlarged plan view illustrating a layout example in a case in which the plurality of wirings are laid in two wiring layers in the lead-out wiring section illustrated in FIG. 5. FIGS. 7 to 12 are enlarged plan views illustrating respective sections (a section A, a section B, a section C, a section D, a section E and a section F) of the wiring of the layout example illustrated in FIG. 6. FIG. 13 is an enlarged plan view illustrating a section G of the wiring illustrated in FIG. 9 in detail. FIG. 14 is an enlarged cross-sectional view taken along a line A-A of FIG. 13.

Figure 15:
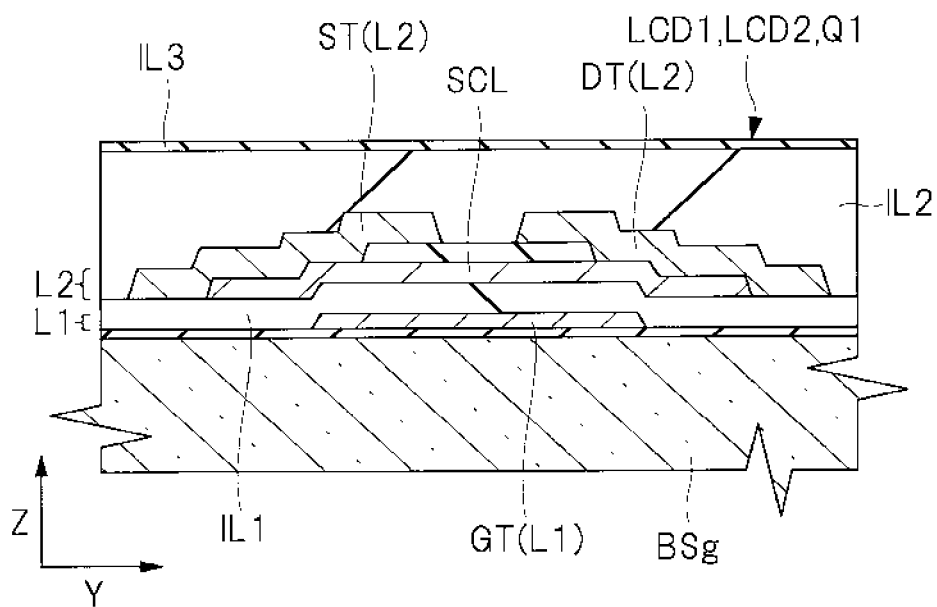
FIG. 15 is an enlarged cross-sectional view illustrating a structure example of a display element provided in a display element section illustrated in FIG. 1.
Figure 16:
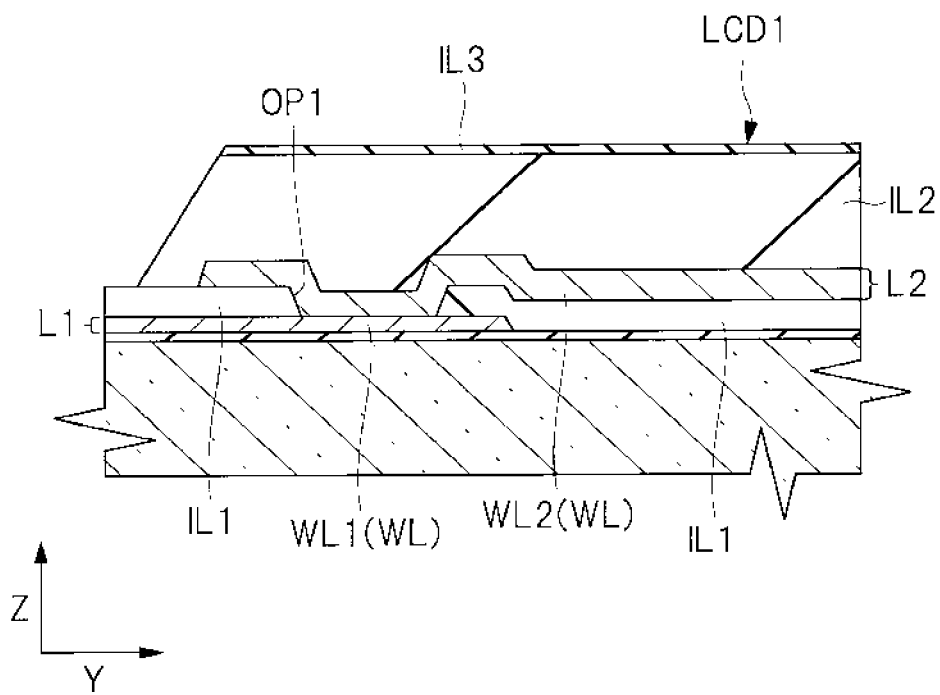
FIG. 16 is an enlarged cross-sectional view illustrating a structure example in which a wiring of a wiring layer of a first layer and a wiring of a wiring layer of a second layer illustrated in FIG. 14 are electrically connected.

In addition, FIG. 15 is an enlarged cross-sectional view illustrating a structure example of the display element provided in the display element section illustrated in FIG. 1. FIG. 16 is an enlarged cross-sectional view illustrating a structure example in which a wiring of a wiring layer of a first layer and a wiring of a wiring layer of a second layer illustrated in FIG. 14 are electrically connected.

Figure 17:
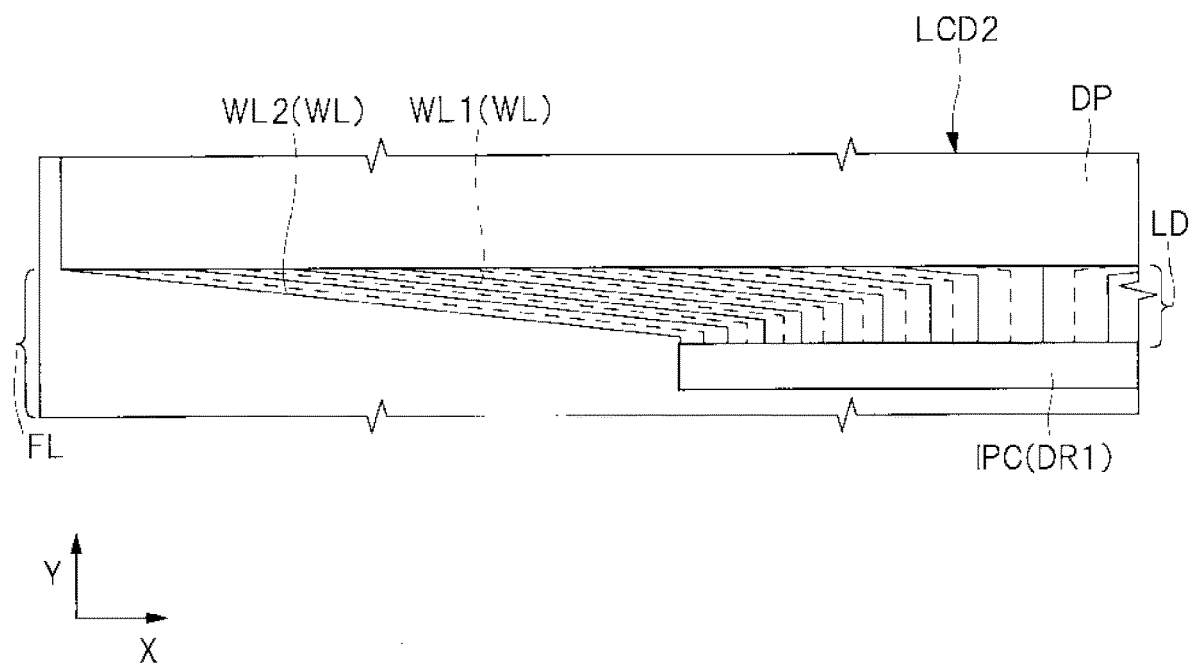
FIG. 17 is an enlarged plan view illustrating a layout example in a case in which a plurality of wirings are laid in two wiring layers in a comparative example corresponding to FIG. 6.
Figure 18:
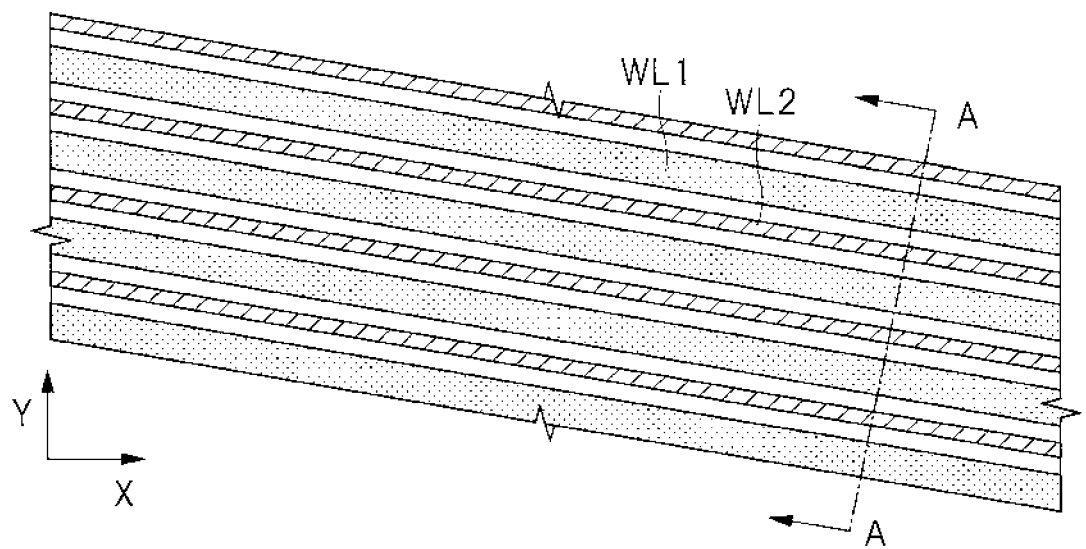
FIG. 18 is an enlarged plan view illustrating the wiring of the comparative example corresponding to FIG. 13 in detail.
Figure 19:
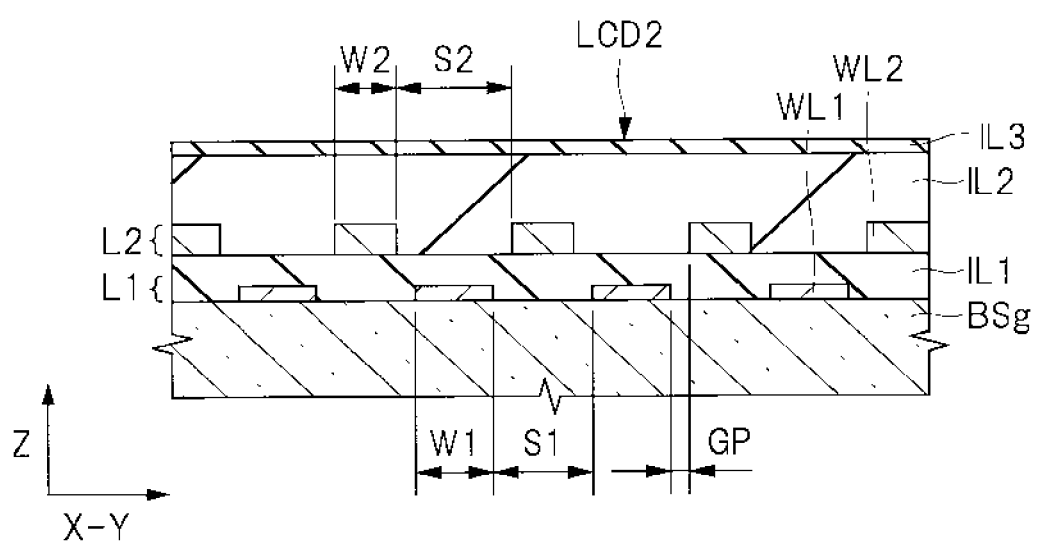
FIG. 19 is an enlarged cross-sectional view taken along a line A-A of FIG. 18.

In addition, FIGS. 17 to 19 are diagrams for describing a display device according to a comparative example with respect to the present embodiment. FIG. 17 is an enlarged plan view illustrating a layout example in a case in which a plurality of wirings are laid in two wiring layers in a comparative example corresponding to FIG. 6. FIG. 18 is an enlarged plan view illustrating the wiring of the comparative example corresponding to FIG. 13 in detail. FIG. 19 is an enlarged cross-sectional view taken along a line A-A of FIG. 18.

Note that a first wiring WL1 formed in a first layer is illustrated by a dotted line, a second wiring WL2 formed in a second layer is illustrated by a solid line, and a conversion region CA formed by dividing a two-layered portion of the first layer and the second layer to change a layer structure is illustrated by a thick solid line in FIGS. 6 and 17 in order to easily distinguish the first wiring WL1 and the second wiring WL2 formed in different layers. In addition, FIG. 6 illustrates only a left half of the lead-out wiring section LD illustrated in FIG. 1 from the center line in the X direction. The same is true of FIG. 17. In addition, the first wiring WL1 formed in the first layer is illustrated by dots, and the second wiring WL2 formed in the second layer is illustrated by hatching in FIGS. 7 to 12.

In the respective drawings, the wiring WL is an example of the signal line of the present invention. In addition, a first signal line SW1 is an example of a first signal line of the present invention, and a second signal line SW2 is an example of a second signal line of the present invention. The drive circuit DR1 is an example of a driving driver of the present invention. The frame section FL is an example of the edge region of the present invention, and the display section DP is an example of the pixel region of the present invention.

A plurality of wirings WL including a plurality of drive signal lines to transmit a video signal to the display element section DPQ and a plurality of drive signal lines to transmit a gate signal to the display element section DPQ are formed in the lead-out wiring section LD illustrated in FIG. 1. It is necessary to increase the number of drive signal lines in order to increase the number of pixels of a display device and improve the definition of a display image, and thus, a technique of arranging a large number of the wirings WL in a limited space is required.

For this purpose, by distributing the large number of wirings WL to a plurality of laminated wiring layers, the large number of wirings WL can be efficiently laid out in the frame section FL. Further, the inventors of the present application have conducted a study regarding a technique of efficiently laying out the plurality of wirings WL while suppressing the influence on the performance of the display device in a case in which the plurality of wirings WL are distributed to the plurality of laminated wiring layers.

First, a length PL1 of the input unit IPC and a length PL2 of the display section DP in the X direction are different from each other as illustrated in FIG. 5. Thus, some of the wirings WL which electrically connect the input unit IPC and the display section DP need to extend in a direction crossing the X direction and the Y direction orthogonal to the X direction. Thus, the lead-out wiring section LD has a portion in which the plurality of wirings WL extend along the direction crossing the Y direction and the X direction between the display section DP and the input unit IPC. In other words, the plurality of wirings WL include portions extending in an oblique direction at arbitrary angles with respect to the Y direction and the X direction. In addition, the plurality of wirings WL desirably have a portion extending along the Y direction.

In a case in which the length PL1 of the input unit IPC is decreased by reducing a length of a chip for cost reduction of the chip or a case in which a spacing between the side BSs1 of the substrate BS and the display section DP is narrowed for a narrow frame in the frame section FL, a distance between the neighboring wirings WL becomes narrow in the portion in which the plurality of wirings WL extend along the direction crossing the Y direction and the X direction like in the present embodiment. In other words, it is necessary to efficiently lay out the wirings WL in the portion in which the plurality of wirings WL extend along the direction crossing the Y direction and the X direction.

Next, a case in which the plurality of wirings WL are evenly distributed and laid in two wiring layers with an insulating film interposed therebetween like in a display device LCD2 illustrated in FIGS. 17 to 19 will be studied as the comparative example with respect to the present embodiment. For example, one wiring layer and the other wiring layer with the insulating film interposed therebetween are the same layer as a gate electrode of the TFT and the same layer as source and drain electrodes of the TFT, respectively. In the case in which the wirings WL are laid in the two wiring layers, the first wiring WL1 provided in a wiring layer L1 (see FIG. 19) of the first layer and the second wiring WL2 provided in a wiring layer L2 (see FIG. 19) of the second layer are provided so as not to overlap each other as illustrated in FIGS. 17 to 19.

However, when seen in a plan view, the first wiring WL1 and the second wiring WL2 are alternately arrayed in different layers in the example of the display device LCD2 as illustrated in FIGS. 17 to 19. In this case, a space between the neighboring first wirings WL1 among a plurality of the first wirings WL1 formed in the wiring layer L1 (see FIG. 19) of the first layer can be used as a region to form the second wiring WL2.

Meanwhile, there is a case in which a wiring material, a wiring thickness, a wiring width, a distance between wirings and the like are made different for each of the wiring layers because of a reason on a manufacturing process or the like in a case in which the wirings WL are formed in each of the plurality of wiring layers like in the display device LCD2. For example, the case in which the TFTs are formed as the plurality of display elements in the display element section DPQ illustrated in FIG. 1 has been described. It is preferable to collectively form the plurality of wiring layers at the time of forming the gate electrode and the source electrode of the TFT from a point of view to efficiently form the plurality of wiring layers of the lead-out wiring section LD illustrated in FIGS. 17 to 19. In this case, there is a case in which the wiring material, the wiring thickness, the wiring width and the distance between wirings are made different for each of the wiring layers because of a manufacturing process of the TFT.

For example, when the above-described TFT serving as the display element has a bottom gate structure in which a gate electrode GT is formed on a lower side than a source electrode ST and a drain electrode DT like in a transistor Q1 illustrated in FIG. 15, the gate electrode GT is formed in the wiring layer L1 of the first layer. In addition, the source electrode ST and the drain electrode DT are formed in the wiring layer L2 of the second layer. In the example illustrated in FIG. 15, the gate electrode GT is formed in the wiring layer L1 of the first layer, and is covered with an insulating film IL1 serving as a gate insulating film. The insulating film IL1 is an inorganic insulating film which is made of, for example, silicon oxide, silicon nitride or a laminated film thereof. In addition, the source electrode ST and the drain electrode DT are formed in the wiring layer L2 of the second layer provided on the insulating film ILL and is covered with an insulating film IL2. The insulating film IL2 is an insulating film which functions as a protective film of the transistor Q1 and the wiring layer L2. Since the insulating film IL2 covers the transistor Q1, it is configured of an organic film having a better coatability than an inorganic film, and the insulating film IL2 is further covered with an insulating film IL3 made of an inorganic insulating film such as silicon nitride.

In a manufacturing process of the transistor Q1 illustrated in FIG. 15, the gate electrode GT is formed, and then, a semiconductor layer SCL is formed on the insulating film IL1 serving as the gate insulating film which covers the gate electrode GT. Although the transistor of FIG. 15 is the bottom gate transistor, there is also a top gate transistor in which a semiconductor layer is formed on a side close to the base material BSg, a gate insulating film is formed after forming the semiconductor layer, and a gate electrode is provided on the gate insulating film. Heat treatment is sometimes performed at the time of forming the transistor, and the first wiring WL1 (see FIGS. 17 to 19) which is formed in the wiring layer L1 in which the gate electrode GT is formed is required to have the resistance to the heat treatment in many cases. Thus, the first wiring WL1 which is formed in the wiring layer L1 is formed of a metal material with a high melting point such as molybdenum (Mo), chromium (Cr) or the like. Meanwhile, since the source electrode ST and the drain electrode DT can be formed after the heat treatment, it is possible to use a low-resistance metal material such as aluminum (Al) or the like for the second wiring WL2 (see FIGS. 17 to 19) which is formed in the wiring layer L2. Note that each of the first wiring WL1 and the second wiring WL2 is not limited to a single metal layer, and may be a layer in which a plurality of metals or metal oxides such as indium oxide are laminated. It is possible to use the wiring formed of a laminated film of, for example, titanium (Ti)/aluminum (Al)/titanium (Ti), molybdenum (Mo)/aluminum (Al)/molybdenum (Mo), molybdenum (Mo)/indium oxide and chromium (Cr)/indium oxide.

As described above, it has been found out that there are problems as follows in a case in which the first wiring WL1 and the second wiring WL2 are simply arrayed in an alternate manner when the wiring material, the wiring thickness, the wiring width, the distance between wirings and the like are made different for each of the wiring layers. For example, in the case of laying out the large number of wirings WL in the evenly distributed manner in the plurality of (generally, two and can be three or more) wiring layers, the following problems are caused. First, there is a problem that the wiring resistance increases in the wiring WL using a wiring layer with a high resistance value. Further, there is also a problem that a capacitance of the wiring WL increases because a capacitance between the wiring layers is added. In addition, there is also a problem that when a resistance difference occurs for each of the wirings WL due to resistance difference among the wiring layers, irregularities are caused in reaching speed of signals to the respective pixels, so that display defects such as streaks are generated. Since these problems affect the performance of the display device, the improvement is necessary.

In addition, a problem that the parasitic capacitance drastically increases is caused when the wirings WL formed in the different wiring layers are overlapped immediately above or immediately below each other. On the other hand, a width of the frame section FL in which the wirings WL are provided increases unless the wirings WL formed in different wiring layers are overlapped with each other. In addition, a line-and-space (L/S) value which indicates a wiring width and a spacing distance of the wirings WL formed in the wiring layers is set to an L/S value of the wiring layer whose minimum L/S value is the largest among those of the wiring layers to be used. Accordingly, the width of the frame section FL in which the wirings WL are provided similarly increases.

Thus, the inventors of the present application have conducted a further study regarding the technique of efficiently laying out the plurality of wirings WL in two wiring layers while suppressing the influence on the performance of the display device, and have found out the configuration of the present embodiment illustrated in FIGS. 6 to 14. In FIG. 6, a layout example in a case in which the plurality of wirings are laid in the two wiring layers is illustrated, and a portion in which three wirings form one set is extracted. FIGS. 7 to 12 illustrate layout examples of each portion of the section A, the section B, the section C, the section D, the section E and the section F in the extracted portion in which the three wirings form one set. FIGS. 7 to 12 illustrate a plurality of the portions in which the three wirings form one set.

Figure 7:
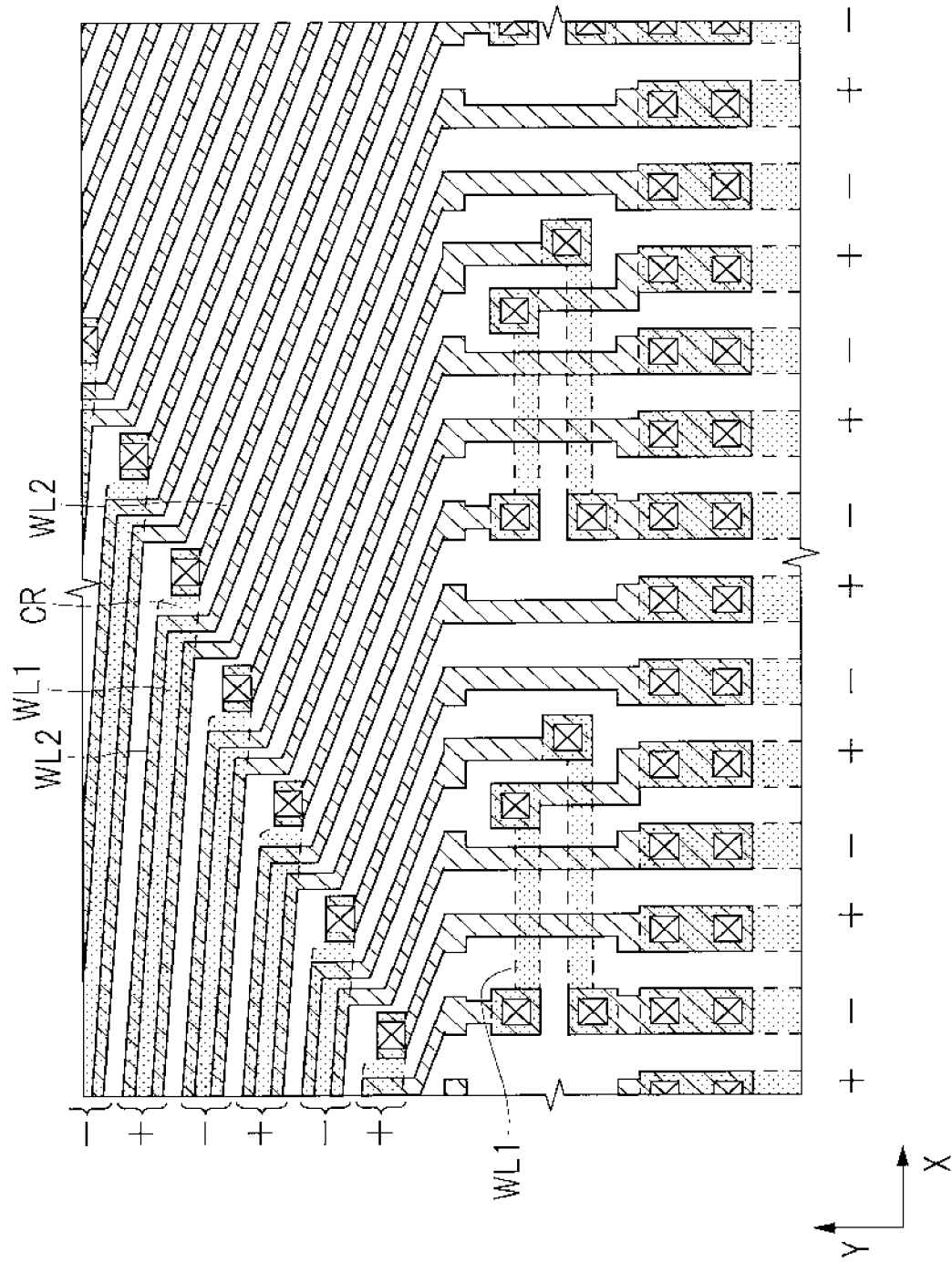
FIG. 7 is an enlarged plan view illustrating a section A of the wiring in the layout example illustrated in FIG. 6.
Figure 10:
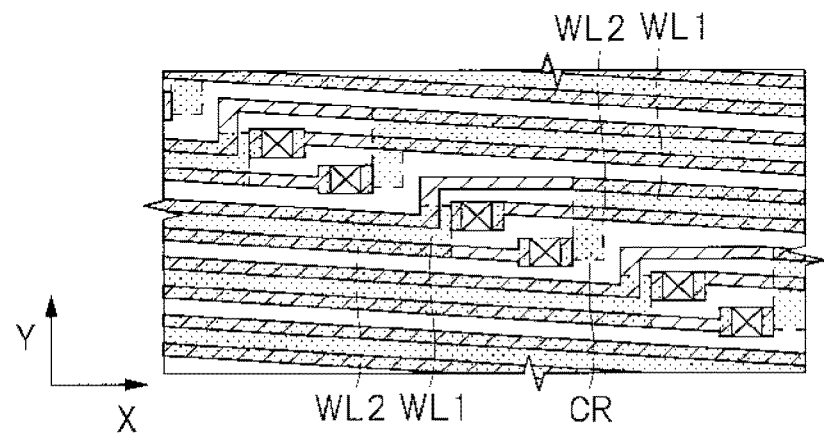
FIG. 10 is an enlarged plan view illustrating a section D of the wiring in the layout example illustrated in FIG. 6.

FIG. 7 illustrates a portion (the section A) immediately after the output from the input unit IPC, and an interchanging structure of the wirings for matching the polarities. FIGS. 8, 9, 10 and 11 illustrate each portion in which a two-layered portion of the first layer and the second layer is divided (the section B, the section C, the section D and the section E), and a structure of a conversion portion that changes a wiring passing through the second layer. FIG. 12 illustrates an input portion (the section F) to the display section DP, and a structure of an intersection portion for interchanging the wirings so as to make a polarity return to an original state. In addition, FIG. 13 is a diagram in which the section G extracted from FIG. 9 is illustrated, and FIG. 14 illustrates a cross-sectional view cut along a line A-A of FIG. 13.

In the display device LCD1 of the present embodiment, the wiring WL is a signal line group to which the drive signal (any one of drive signals of the gate signal and the video signal) is supplied as illustrated in FIG. 6. The first signal line SW1 which is a part of the wiring WL includes the second wiring WL2 formed in the second layer and the first wiring WL1 formed by dividing a two-layered portion of the first layer and the second layer to change a layer structure. The first signal line SW1 is connected to the drive circuit DR1 in the input unit IPC, and is formed in the frame section FL and the display section DP. The second wiring WL2 is formed to run through the wiring layer L2 of the second layer (see FIG. 14) in the frame section FL, and the first wiring WL1 is formed to pass through the wiring layer L1 of the first layer (see FIG. 14) from the wiring layer L2 of the second layer.

The second signal line SW2 which is a part of the wiring WL is also connected to the drive circuit DR1 in the input unit IPC, and is formed in the frame section FL and the display section DP. However, the second signal line SW2 does not include the first wiring WL1 although the second signal line SW2 includes the second wiring WL2 formed in the second layer.

The first wiring WL1 using the metal of Mo is formed in the wiring layer L1 of the first layer, and the second wiring WL2 using the metal of Ti/Al/Ti is formed in the wiring layer L2 of the second layer.

As illustrated in FIGS. 8 to 11 and FIGS. 13 and 14, the first wiring WL1 formed in the wiring layer L1 of the first layer and the second wiring WL2 formed in the wiring layer L2 of the second layer are formed to overlap each other when seen in a plan view. For example, in the configuration in which three wirings WL including one first wiring WL1 formed in the wiring layer L1 of the first layer and two second wirings WL2 formed in the wiring layer L2 of the second layer form one set as illustrated in FIG. 14, both end portions of the first wiring WL1 in the Y direction are arranged to be overlapped in a Z direction with one end portion of the second wiring WL2 in the Y direction.

The first wiring WL1 formed in the wiring layer L1 of the first layer and the second wiring WL2 formed in the wiring layer L2 of the second layer are different in materials. As described above, the first wiring WL1 is made of the metal of Mo, and the second wiring WL2 is made of the metal of the laminated film of Ti/Al/Ti. In addition, a specific resistance of Mo which is the material of the first wiring WL1 is $5.6\times10^{-8}$ Ωm (at temperature of 20° C.). Meanwhile, in the laminated film of Ti/Al/Ti which is the material of the second wiring WL2, a specific resistance of Al which is a main material thereof is $2.75\times10^{-8}$ Ωm (at temperature of 20° C.). As described above, the specific resistance of the material of the second wiring WL2 is lower than the specific resistance of the material of the first wiring WL1. Note that, when a wiring is a laminated film constituted of a plurality of materials, a specific resistance of the material of the wiring corresponds to a specific resistance of a main material thereof.

The material of the first wiring WL1 and the material of the second wiring WL2 may be the same material. In addition, when different materials are used, it is preferable that a specific resistance of the main material of the second wiring WL2 is lower than a specific resistance of a material of the first wiring WL1. In addition, the specific resistance of the material of the second wiring WL2 relative to the specific resistance of the material of the first wiring WL1 is preferably three times or less in consideration of a balance in transmission speed of the signal between the respective wirings.

In addition, the first wiring WL1 formed in the wiring layer L1 of the first layer and the second wiring WL2 formed in the wiring layer L2 of the second layer are different from each other in terms of the wiring width, the thickness, wiring density and the like. The main reasons therefor are to reduce the parasitic capacitance between the respective wirings and to obtain a balance of the resistance values between the first wiring WL1 and the second wiring WL2. In addition, when the wiring group and the seal material SLp (see FIG. 4) of the seal portion SL overlap each other, it is possible to form a gap GP to be described later, so that an ultraviolet ray can pass through the inside of the display device and the seal material SLp provided to be overlapped with the wiring can be cured. For example, a wiring width W1 of the first wiring WL1 is larger than a wiring width W2 of the second wiring WL2 in FIG. 14. In addition, a spacing distance S1 of the first wirings WL1 is larger than a spacing distance S2 of the second wirings WL2.

With respect to the thickness of the first wiring WL1 and the second wiring WL2, the thickness of the second wiring WL2 is larger than the thickness of the first wiring WL1. In addition, the thickness of the insulating film IL2 is larger than the thickness of the insulating film IL1.

With respect to the wiring density of the first wirings WL1 and the second wiring WL2, for example, the three wirings WL form one set, and the two second wirings WL2 among them are arranged in the wiring layer L2 of the second layer and the single first wiring WL1 is arranged in the wiring layer L1 of the first layer in FIG. 14. In this manner, the wiring density of the second wirings WL2 is higher than the wiring density of the first wirings WL1. In other words, the first wiring WL1 is made of the material with the high resistance, and the number of the second wirings WL2 in a wiring layer with a lowest resistance value or a wiring layer with the small L/S value is larger than the number of the first wirings WL1 in the other wiring layer.

In addition, the gap GP in which the first wiring WL1 is not formed is provided between the second wirings WL2 of the neighboring sets in the structure in which the three wirings WL form one set as illustrated in FIG. 14. This gap GP is an opening portion to irradiate a UV-curable resin used as the seal material SLp (see FIG. 4) of the seal portion SL formed in the frame section FL with the ultraviolet light. Namely, the seal material SLp made of the UV-curable resin is formed in the frame section FL of the display device LCD1 as illustrated in FIG. 4 and the like. Further, the substrate BS is made of the glass substrate or the like as described above and is optically transparent. Further, the wirings WL are formed so that the gap GP through which the UV-curable resin can be irradiated with the ultraviolet light through the substrate BS can be created in an overlapping region in which a region in which the wiring WL is formed and a region in which the UV-curable resin is formed overlap each other. In other words, the wirings WL are formed so that a gap between the first wirings WL1 and a gap between the second wirings WL2 overlap each other.

In addition, in the structure in which the three wirings WL form one set, for example, a conversion portion CR which converts the layer structure between the neighboring first wiring WL1 and second wiring WL2 is provided in the frame section FL of the display device LCD1 as illustrated in FIG. 6. Namely, the conversion portion CR which converts the wiring WL passing through the first wiring WL1 via the opening portion penetrating an insulating layer is provided in the frame section FL. Hereinafter, details of the wiring will be described with using a gate signal line or a video signal line as a specific example of the wiring.

Figure 8:
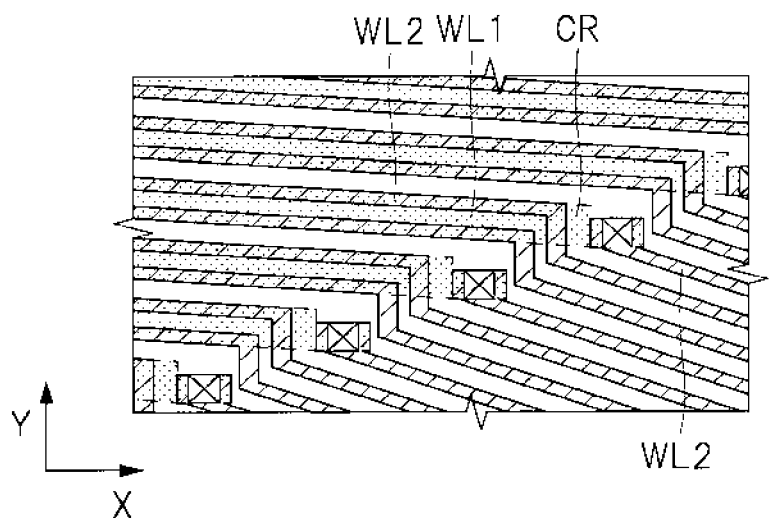
FIG. 8 is an enlarged plan view illustrating a section B of the wiring in the layout example illustrated in FIG. 6.
Figure 9:
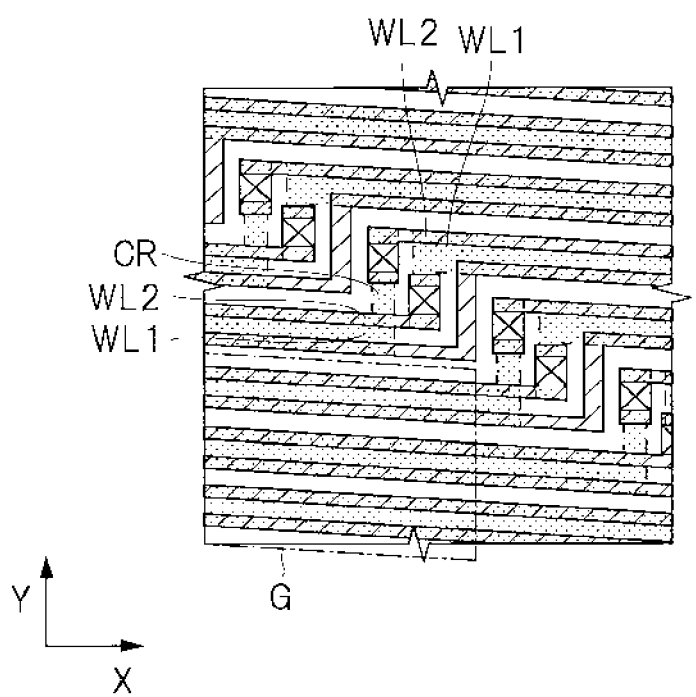
FIG. 9 is an enlarged plan view illustrating a section C of the wiring in the layout example illustrated in FIG. 6.

In FIG. 8 illustrating the section B in FIG. 6, a signal line passing through the second wiring WL2 is converted into a different layer to pass through the first wiring WL1 which is the wiring of a different layer in the vicinity of the conversion portion CR. Next, in FIG. 9 illustrating the section C in FIG. 6, the signal line passing through the first wiring WL1 in FIG. 8 is converted into a different layer to pass through the second wiring WL2 in the vicinity of the conversion portion CR. Further, in FIG. 8, a signal line passing through the second wiring WL2 is converted into a different layer to pass through the first wiring WL1 in the vicinity of the conversion portion CR. In addition, these two signal lines cross each other in the vicinity of the conversion portion CR. Next, also in FIG. 10 illustrating the section D in FIG. 6, a signal line passing through the first wiring WL1 in FIG. 9 is similarly converted into a different layer to pass through the second wiring WL2 in the vicinity of the conversion portion CR. Further, a signal line which does not pass through the first wiring WL1 in FIGS. 8 and 9 is converted into a different layer to pass through the first wiring WL1 in the vicinity of the conversion portion CR in FIG. 10. Next, in FIG. 11 illustrating the section E in FIG. 6, the signal line passing through the first wiring WL1 in FIG. 10 is converted into a different layer to pass through the second wiring WL2 in the vicinity of the conversion portion CR, and all the signal lines pass through the layer in which the second wirings WL2 are formed.

In this manner, in the structure in which the three wirings WL (signal lines) form one set, the conversion portion CR is provided in the four points of the section B, the section C, the section D and the section E, and the respective wirings are formed to be linked from the section A to the section F. Then, a different signal line is configured to pass through the first wiring WL1 in the vicinity of the conversion portion CR, and accordingly, all the three signal lines as one set eventually pass through the first wiring WL1.

In addition, in the structure in which the three wirings WL form one set, the three wirings of each set have the same polarity in order to reduce an effective parasitic capacitance. For example, in a case in which polarities of signals to be supplied from the input unit IPC are opposite between the neighboring wirings like in FIG. 7 illustrating the section A in FIG. 6, an array order of the wirings is changed by providing an intersection portion before the conversion portion CR to make the three wirings as one set have the same polarity. In other words, the array order is altered by the intersection portion so that the sets with different polarities are alternately disposed in such a manner that the three wirings as one set with the positive polarity are arranged next to the three wirings as one set with the negative polarity or the like.

Further, in an input portion to the display section DP, the three signal lines as one set having the same polarity are altered so that the polarities of the signal lines return to the original states such as from the positive polarity to the negative polarity and from the positive polarity to the negative polarity like in FIG. 12 illustrating the section F in FIG. 6. The polarities of the signal lines are controlled in this manner for the purpose that the driving by AC application to alternately apply positive and negative voltages is performed to prevent the reduction in service life due to the imbalance between positive and negative charges on the pixel electrode side.

In addition, as illustrated in FIG. 6, the signal line led out from the input unit IPC uses the second wiring WL2 of the second layer between the input unit IPC and the display section DP. Then, the signal line is connected to the conversion region CA in which the conversion portion CR to convert the wiring layer to pass through is formed. Further, the signal line passes through the first wiring WL1 of the first layer inside the conversion region CA, and is again connected to the second wiring WL2 to be connected to the display section DP.

In such a wiring structure of the wirings from the input unit IPC to the display section DP, parts in which the conversion portions CR are present are formed in a region between an end portion EG11 of the input unit IPC and an end portion EG12 of the display section DP in the Y direction in FIG. 6. Namely, the input unit IPC is provided in the Y direction with respect to the display section DP, and the conversion portions CR are provided in the region between the end portion EG11 of the input unit IPC and the end portion EG12 of the display section DP in the Y direction. From a different point of view, the conversion portion CR is not provided between a position P21 which is a middle position between an end portion EG21 of the input unit IPC and an end portion EG22 of the display section DP in the X direction and the end portion EG22 of the display section DP in FIG. 6. Alternatively, the conversion portion CR is provided between the position P21 which is the middle position between the end portion EG21 of the input unit IPC and the end portion EG22 of the display section DP in the X direction and a position P22 at the center of the display section DP.

In addition, a wiring group which is one set of three wirings at the upper side, the center and the lower side illustrated by being extracted in FIG. 6 is provided in the conversion region CA. The lengths of the respective wirings passing through the first wiring WL1 between the conversion portion CR of the section B and the conversion portion CR of the section E are substantially the same. For example, the wiring at the upper side before the conversion portion CR of the section B among the three wirings passes through the first wiring WL1 between the conversion portion CR of the section B and the conversion portion CR of the section C. The wiring at the center before the conversion portion CR of the section B among the three wirings passes through the first wiring WL1 between the conversion portion CR of the section C and the conversion portion CR of the section D. The wiring at the lower side before the conversion portion CR of the section B among the three wirings passes through the first wiring WL1 between the conversion portion CR of the section D and the conversion portion CR of the section E. In this manner, in the structure in which the three wirings form one set, the lengths of the neighboring wirings passing through the first wiring WL1 are substantially the same. The meaning of the expression "substantially the same" is that the lengths of the first wiring WL1 are made uniform to achieve the uniform wiring resistance as a whole, and are within a range of, for example, about 0.7 to 1.3 times.

As described above, the lengths of the neighboring wirings passing through the first wiring WL1 are substantially the same in the structure in which the three wirings form one set. However, the lengths of the wirings passing through the first wiring WL1 are different among the respective sets in which the three wirings form one set. For example, the lengths passing through the first wiring WL1 are different between the wiring arranged at a position close to the input unit IPC and the wiring arranged in the vicinity of the center between the input unit IPC and the display section DP in FIG. 6. Among the respective sets, the length of the first wiring WL1 in the conversion region CA is the shortest at the position close to the input unit IPC, becomes longer as approaching the vicinity of the center between the input unit IPC and the display section DP, and then becomes shorter again at the position close to the display section DP. As a representative example, the lengths of wirings of the respective sets passing through the first wiring WL1 differ more than 1.3 times or less than 0.7 times from one another.

In the structure of the conversion portion to convert the layers of the wirings illustrated in FIGS. 6 to 12 and the like, the wiring layer L1 of the first layer and the wiring layer L2 of the second layer are electrically connected by, for example, the method illustrated in FIG. 16. FIG. 16 is an enlarged cross-sectional view illustrating the structure example in which the wiring of the wiring layer of the first layer and the wiring of the wiring layer of the second layer are electrically connected.

In the example illustrated in FIG. 16, the opening portion OP1 is formed in the insulating film IL1 which covers the wiring layer L1 of the first layer, and the first wiring WL1 is exposed from the insulating film IL1 in the opening portion OP1. In addition, a part of the second wiring WL2 formed in the wiring layer L2 of the second layer is embedded in the opening portion OP1 formed in the insulating film ILL and is electrically connected to the first wiring WL1. By forming the opening portion OP1 in a part of the insulating film IL1 which covers the wiring layer L1 in this manner, the second wiring WL2 in the wiring layer L2 of the second layer and the first wiring WL1 in the wiring layer L1 of the first layer can be electrically connected to each other.

Figure 20:
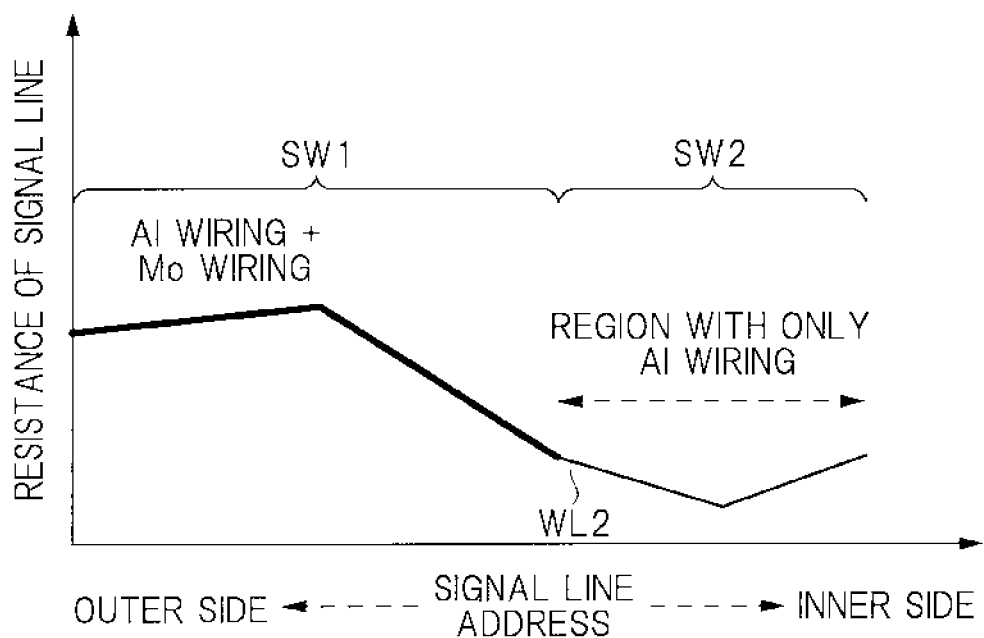
FIG. 20 is an explanatory diagram illustrating resistance characteristics of the wiring in the layout example illustrated in FIG. 6.
Figure 21:
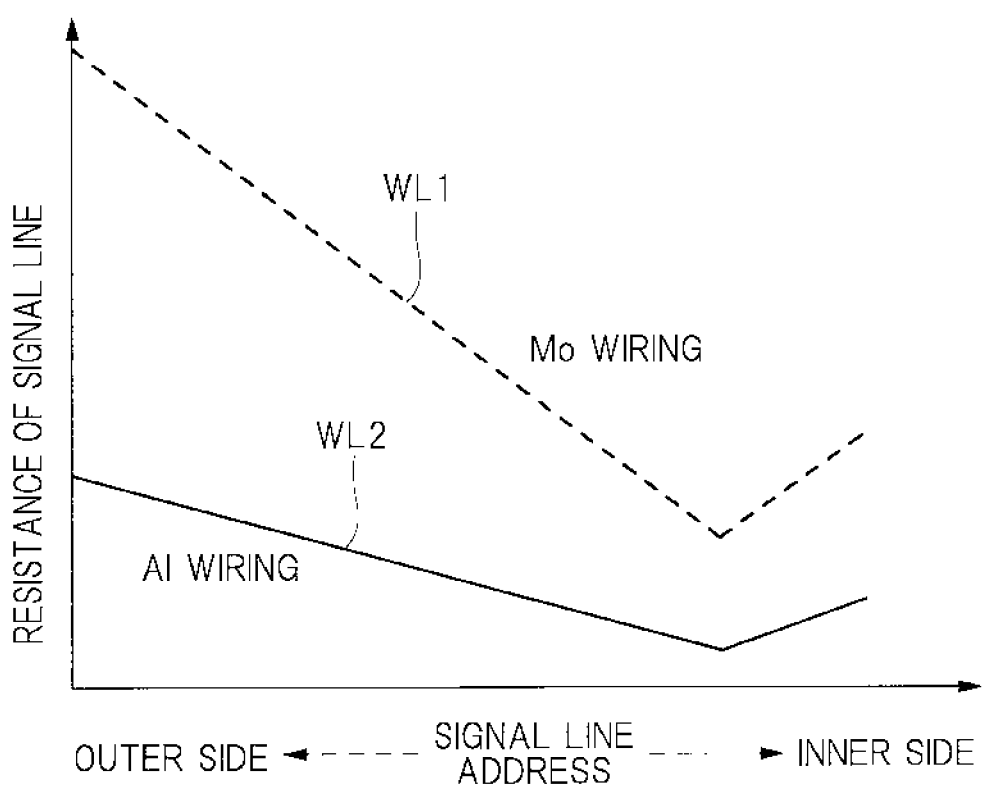
FIG. 21 is an explanatory diagram illustrating resistance characteristics of the wiring in the layout example illustrated in FIG. 17.

Here, differences in resistance characteristics of wirings between the display device LCD1 of the present embodiment illustrated in FIGS. 6 to 14 and the display device LCD2 illustrated in FIGS. 17 to 19 serving as the comparative example with respect to the present embodiment will be described. FIG. 20 is an explanatory diagram illustrating resistance characteristics of the wiring in the layout example illustrated in FIG. 6 in the display device LCD1 of the present embodiment. FIG. 21 is an explanatory diagram illustrating resistance characteristics of the wiring in the layout example illustrated in FIG. 17 in the display device LCD2 of the comparative example with respect to the present embodiment. In FIGS. 20 and 21, the horizontal axis indicates a signal line address, and the vertical axis indicates a resistance of the signal line. The signal line address corresponds to the layout examples illustrated in FIGS. 6 and 17, and an outer side of the signal line address corresponds to a position of the left end portion in the layout examples illustrated in FIGS. 6 and 17 and an inner side of the signal line address corresponds to a position of the right end portion in the layout examples illustrated in FIGS. 6 and 17.

As illustrated in FIG. 21, the first wiring WL1 of the first layer is a wiring made of Mo and the second wiring WL2 of the second layer is a wiring made of Al in the display device LCD2 of the comparative example with respect to the present embodiment. With respect to the resistance of the signal lines, the Mo wiring has the higher resistance and the Al wiring has the lower resistance, and thus, the resistance is different between the wirings. In addition, the resistance of the signal line differs also depending on the signal line address, and it is the highest at the outer side (side away from the input unit IPC) and decreases as approaching the inner side (side close to the input unit IPC). Then, the resistance has the characteristics that it is the lowest at a position close to the inner side and increases at the inner side. When the resistance differs between the wirings and a resistance difference occurs for each signal line due to the resistance difference between the wirings in this manner, this leads to degradation in quality of an image such as streaks that affects the performance of the display device LCD2.

On the other hand, the display device LCD1 of the present embodiment has characteristics illustrated in FIG. 20. FIG. 20 corresponds to the layout example illustrated in FIG. 6, and illustrates an example of a structure in which the layer conversion of some of the wirings is performed and the lengths of the wirings subjected to the layer conversion are balanced. In the characteristics illustrated in FIG. 20, the first signal line SW1 is a wiring in which the first wiring WL1 and the second wiring WL2 are connected, and thus, the resistance difference between the wirings decreases. In addition, the resistance has the characteristics that a variation in resistance in the first signal line SW1 and the second signal line SW2 depending on the signal line address is small from the outer side to the inner side, and the resistance is balanced in the range from the outer side to the inner side. In this manner, it is possible to suppress the occurrence of the streaks caused by the resistance difference for each signal line, and to suppress the influence on the performance of the display device LCD1.

Modified Example

Figure 22:
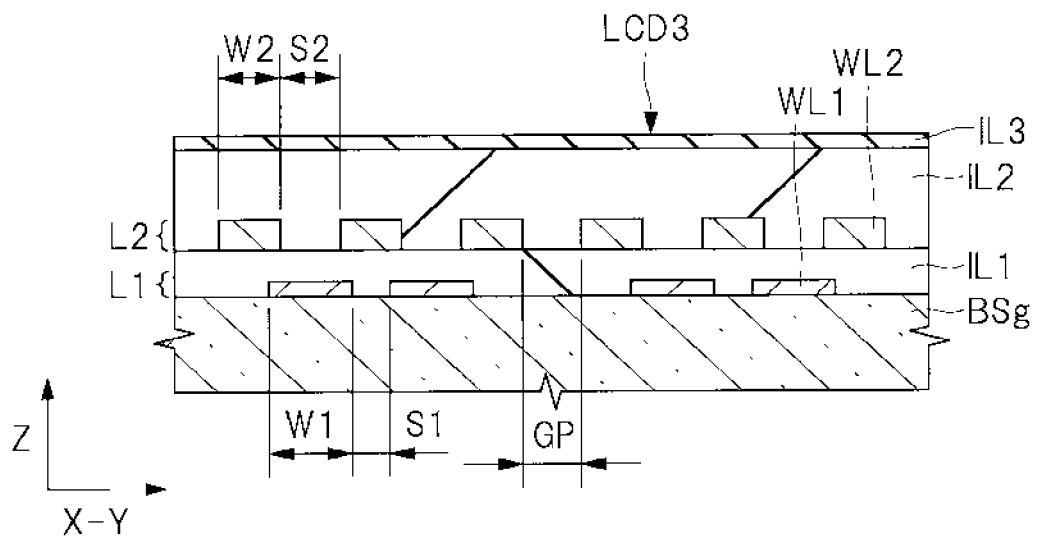
FIG. 22 is an enlarged cross-sectional view illustrating a layout example in a case in which a plurality of wirings, five wirings of which form one set, are laid in two wiring layers in a modified example corresponding to FIG. 6.
Figure 23:
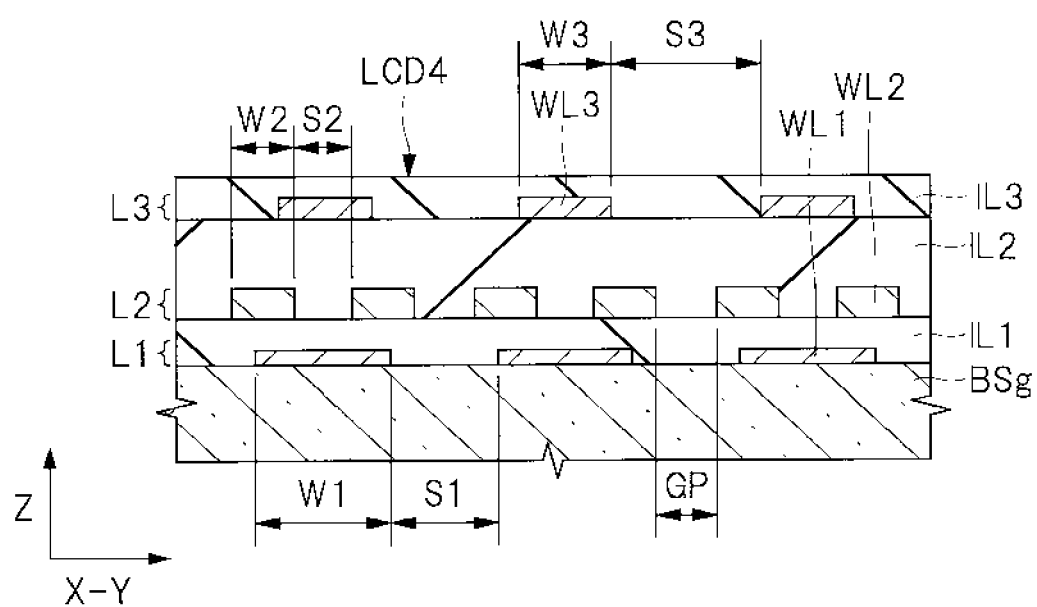
FIG. 23 is an enlarged cross-sectional view illustrating a layout example in a case in which a plurality of wirings, four wirings of which form one set, are laid in three wiring layers in a modified example corresponding to FIG. 6.

Modified examples of the display device LCD1 of the present embodiment will be described. In the modified examples, differences from the display device LCD1 illustrated in FIGS. 6 to 16 described above will be mainly described. FIG. 22 is a modified example with respect to FIG. 6 (FIG. 14), and is an enlarged cross-sectional view illustrating a layout example in a case in which a plurality of wirings, five wirings of which form one set, are laid in two wiring layers. FIG. 23 is a modified example with respect to FIG. 6 (FIG. 14), and is an enlarged cross-sectional view illustrating a layout example in a case in which a plurality of wirings, four wirings of which form one set, are laid in three wiring layers.

In a display device LCD3 of the modified example illustrated in FIG. 22, a structure in which five wirings form one set is applied instead of the above-described structure in which the three wirings form one set, and the five wirings as one set are laid in two wiring layers. As illustrated in FIG. 22, the three second wirings WL2 among the five wirings as one set are arranged in the wiring layer L2 of the second layer, and the two first wirings WL1 are arranged in the wiring layer L1 of the first layer. Also in this structure, the number of the second wirings WL2 in a wiring layer with a lowest resistance value or a wiring layer with a small L/S value is larger than the number of the first wirings WL1 in the other wiring layer, and the wiring density of the second wirings WL2 is higher than the wiring density of the first wirings WL1.

In addition, a wiring width and a spacing distance of the first wiring WL1 and the second wiring WL2 are as follows. For example, in FIG. 22, the wiring width W1 of the first wiring WL1 is larger than the wiring width W2 of the second wiring WL2. In addition, the spacing distance S1 of the first wirings WL1 is smaller than the spacing distance S2 of the second wirings WL2.

Since the display device LCD3 of the modified example illustrated in FIG. 22 is the same as the display device LCD1 illustrated in FIG. 6 to FIG. 16 except for the differences described above, the redundant description thereof will be omitted.

In a display device LCD4 of the modified example illustrated in FIG. 23, a structure in which four wirings as one set are laid in three wiring layers is applied instead of the above-described structure in which the three wirings as one set are laid in two wiring layers. As illustrated in FIG. 23, the two second wirings WL2 among the four wirings as one set are arranged in a wiring layer of a second layer, the single first wiring WL1 is arranged in a wiring layer of a first layer, and a single third wiring WL3 is arranged in a wiring layer of a third layer. Also in this structure, the number of the second wirings WL2 in a wiring layer with a lowest resistance value or a wiring layer with a small L/S value is larger than the number of the first wirings WL1 and the third wirings WL3 in the other wiring layers, and the wiring density of the second wirings WL2 is higher than each wiring density of the first wirings WL1 and the third wirings WL3.

In addition, a material, a wiring width, a spacing distance, a thickness and the like of the first wiring WL1, the second wiring WL2 and the third wiring WL3 are as follows. Any one of a single layer of metal and a laminated film of metal may be used as the material of the third wiring WL3, and aluminum (Al) is used here by way of example.

With respect to the wiring width of the wiring, the wiring width W1 of the first wiring WL1 is larger than the wiring width W2 of the second wiring WL2 and a wiring width W3 of the third wiring WL3. With respect to the spacing distance of the wirings, the spacing distance S1 of the first wirings WL1 is larger than the spacing distance S2 of the second wirings WL2 and is smaller than a spacing distance S3 of the third wirings WL3.

With respect to the thickness of the wiring, a thickness of the second wiring WL2 is larger than a thickness of the first wiring WL1 and a thickness of the third wiring WL3. With respect to the insulating film which covers the wiring, a thickness of the insulating film IL2 is larger than a thickness of the insulating film IL1 and a thickness of the insulating film IL3.

Since the display device LCD4 of the modified example illustrated in FIG. 23 is the same as the display device LCD1 illustrated in FIG. 6 to FIG. 16 except for the differences described above, the redundant description thereof will be omitted.

Effect of Embodiment

According to the display device LCD1 (LCD3, LCD4) of the present embodiment described above, it is possible to provide the technique of efficiently laying out the plurality of wirings WL in the frame section FL of the display device LCD1 while suppressing the influence on the performance of the display device LCD1. The details thereof are as follows.

(1) The first signal line SW1 includes the second wiring WL2 and the first wiring WL1 to which any one of drive signals of the gate signal and the video signal is supplied. Further, the first signal line SW1 is formed to pass through the first wiring WL1 formed in the first layer from the second wiring WL2 formed in the second layer in the frame section FL. When a range of the wirings WL which contributes to the narrowing of the frame section FL is formed to have a two-layered structure in the conversion region CA in this manner, it is possible to suppress the increase of the resistance and the increase of the capacitance in the case of laying out the plurality of wirings WL to be distributed to the two wiring layers. In addition, it is possible to reduce a difference in resistance and capacitance between the wirings by changing the structure of the two-layered portion in the conversion region CA.

(2) When seen in a plan view, the first wiring WL1 and the second wiring WL2 are formed to overlap each other. By overlapping the first wiring WL1 formed in the first layer and the second wiring WL2 formed in the second layer in this manner, it is possible to contribute to the narrowing of the frame.

(3) The specific resistance of the material of the second wiring WL2 is set to be lower than the specific resistance of the material of the first wiring WL1. By reducing the resistance of the second wiring WL2 as the main wiring in this manner, it is possible to suppress the influence on the performance of the display device.

(4) The line width of the first wiring WL1 is set to be larger than the line width of the second wiring WL2. By increasing the line width of the first wiring WL1 in this manner, it is possible to lower the wiring resistance of the first wiring WL1 with the high resistance.

(5) The thickness of the second wiring WL2 is set to be larger than the thickness of the first wiring WL1. By making the thickness of the first wiring WL1 relatively small and making the thickness of the second wiring WL2 relatively large in this manner, it is possible to reduce a risk of short circuit between the first wiring WL1 and the second wiring WL2.

(6) The wiring density of the second wirings WL2 is set to be higher than the wiring density of the first wirings WL1. By making the wiring density of the first wirings WL1 relatively low and making the wiring density of the second wirings WL2 relatively high in this manner, it is possible to sparsely form the first wirings WL1 having the low wiring density, and to reduce the parasitic capacitance. In addition, since the wiring density of the second wirings WL2 is high and the number of the second wirings WL2 is relatively large, it is possible to secure an opening portion for curing the seal material in the one-drop fill (ODF) process periodically.

(7) The intersection portion in which a plurality of the first wirings WL1 and the second wirings WL2 are caused to cross each other to change the array order of the first wiring WL1 and the second wiring WL2 is provided in the frame section FL. By providing the intersection portion in this manner, it is possible to change the array order of the first wiring WL1 and the second wiring WL2 to make the polarities of the wirings uniform. In addition, since the group with the strong parasitic capacitance among the wirings is controlled to the same polarity, it is possible to reduce the effective parasitic capacitance.

(8) The conversion portions CR are formed in the region in the Y direction between the end portion of the input unit IPC and the end portion of the display section DP in the frame section FL when seen in a plan view. By forming the conversion portions CR only in the range that contributes to the narrowing of the frame section FL in this manner, it is possible to suppress the increase of the resistance and the increase of the capacitance.

(9) The conversion portion CR is not formed between the middle position between the end portion of the input unit IPC and the end portion of the display section DP in the X direction and the end portion of the display section DP. Alternatively, the conversion portion CR is formed between the middle position between the end portion of the input unit IPC and the end portion of the display section DP in the X direction and the position at the center of the display section DP. By forming no conversion portion CR in the range that does not contribute to the narrowing of the frame section FL and forming the conversion portions CR only in the range that contributes to the narrowing in this manner, it is possible to suppress the increase of the resistance and the increase of the capacitance.

(10) Among the wirings WL of each set in the conversion region CA, the neighboring wirings pass through the first wiring WL1 and the lengths of the neighboring wirings passing through the first wiring WL1 in the first layer are set to be substantially the same. When the lengths of the wirings WL passing through the first wiring WL1 are set to be substantially the same in each set in this manner, it is possible to make the resistances of the neighboring wirings uniform among the wirings in each set inside the conversion region CA.

(11) The plurality of wirings WL include the second signal line SW2 which passes through the second wiring WL2 and does not pass through the first wiring WL1 of the first layer. By providing the signal line like this, it is possible to select an appropriate type of a signal line in accordance with a distance between the display section DP and the input unit IPC, and to take the balance in the wiring resistance as a whole.

(12) In the overlapping region in which the region in which the first wiring WL1 and the second wiring WL2 are formed and the region in which the UV-curable resin is formed overlap each other, the first wiring WL1 and the second wiring WL2 are formed so as to create the gap GP. By forming the gap GP in this manner, it is possible to irradiate the UV-curable resin with the ultraviolet light through the gap GP.

(13) The effects according to the above-described (1) to (12) can be similarly achieved in the case in which a plurality of wirings are laid out to have a multilayered structure of three or more layers other than the case in which the plurality of wirings are laid out to have the two-layered structure. According to the present embodiment, it is possible to achieve both of the narrowing of the frame and the ODF process without degrading the performance of the display device by adding the novel technique of using the partially-multilayered structure and the change of the layer structure to the multilayer wiring of the related art.

It should be understood that the person skilled in the art can conceive various types of modified examples and corrections in the category of the idea of the present invention, and these modified examples and corrections also belong to the scope of the present invention. For example, those obtained when the person skilled in the art appropriately modifies the embodiments above by addition, deletion or design change of components or by addition, omission, or condition change of steps are also included within the scope of the invention as long as they have the gist of the present invention.

In addition, it should be understood that other operational effects achieved by the aspects described in the present embodiment which are apparent from the description of the present specification or can be appropriately conceived by the person skilled in the art are, of course, derived from the present invention.

The invention claimed is:

1. A transistor substrate comprising:
a base material;
a first lead-out wiring on the base material;
a second lead-out wiring on the base material;
a third lead-out wiring on the base material;
an organic insulating film covering the first, the second, and the third lead-out wirings;
a metal wiring on the organic insulating film; and
a semiconductor chip electrically connected to the first, the second, and the third lead-out wirings,
wherein one of the first, the second, or the third lead-out wirings overlaps with other two of the first, the second, or the third lead-out wirings, and
wherein the metal wiring overlaps with the first, the second, and the third lead-out wirings.

2. The transistor substrate according to claim 1, further comprising a first inorganic insulating film,
wherein the organic insulating film is between the base material and the first inorganic insulating film,
wherein the first, the second, and the third lead-out wirings are between the base material and the organic insulating film, and
wherein the metal wiring is between the organic insulating film and the first inorganic insulating film.

3. The transistor substrate according to claim 2,
wherein the first, the second, and the third lead-out wirings are treated as one set.

4. The transistor substrate according to claim 2, further comprising:
first metal lines formed in a first metal layer;
second metal lines formed in a second metal layer; and
a second inorganic insulating film arranged between the first metal layer and the second metal layer,
wherein each of the first, the second, and the third lead-out wirings is formed to pass through a respective first metal line of the first metal lines from a respective second metal line of the second metal lines, and
wherein in a first region, the first metal line of the third lead-out wiring overlaps the second metal line of the first lead-out wiring and overlaps the second metal line of the second lead-out wiring.

5. The transistor substrate according to claim 4,
wherein the first metal line of the third lead-out wiring overlaps the metal wiring,
wherein the second metal line of the first lead-out wiring overlaps the metal wiring, and
wherein the second metal line of the second lead-out wiring overlaps the metal wiring.

6. The transistor substrate according to claim 5,
wherein the first metal line includes a first edge and a second edge opposed to the first edge, the second metal line includes a third edge and a fourth edge opposed to the third edge, a first line width of the first metal line between the first edge and the second edge is larger than a second line width of the second metal line between the third edge and the fourth edge,
wherein the third edge of the second metal line of the second lead-out wiring faces the fourth edge of the second metal line of the first lead-out wiring,
wherein the fourth edge of the second metal line of the second lead-out wiring and the third edge of the second metal line of the first lead-out wiring overlap the first metal line of the third lead-out wiring and the metal wiring, and
wherein the third edge of the second metal line of the second lead-out wiring and the fourth edge of the second metal line of the first lead-out wiring do not overlap the first metal line of the third lead-out wiring and the metal wiring.

7. The transistor substrate according to claim 6,
wherein the second metal lines are in contact with a first surface of the organic insulating film,
wherein the metal wiring is in contact with a second surface of the organic insulating film which is opposed to the first surface, and
wherein the metal wiring includes a fifth edge and a sixth edge that is opposed to the fifth edge, the fifth edge of the metal wiring is located between the third edge and the fourth edge of the second metal line of the first lead-out wiring, in a plan view, and the sixth edge of the metal wiring is located between the third edge and the fourth edge of the second metal line of the second lead-out wiring, in the plan view.

8. The transistor substrate according to claim 7,
wherein a thickness of the metal wiring is smaller than a thickness of the second metal line, and the thickness of the metal wiring is larger than a thickness of the first metal line.

9. The transistor substrate according to claim 4,
wherein the semiconductor chip includes a first portion electrically connected to the first lead-out wiring, a second portion electrically connected to the second lead-out wiring, and a third portion electrically connected to the third lead-out wiring, and
wherein the second portion is located between the first portion and the third portion in a plan view, and
in the first region, the third lead-out wiring is located between the second lead-out wiring and the first lead-out wiring in the plan view.

10. The transistor substrate according to claim 9,
wherein the semiconductor chip further includes a fourth portion located between the first portion and the second portion, and a fifth portion located between the second portion and the third portion, in the plan view, and
wherein in the first region, the second metal line of the first lead-out wiring is located adjacent to the second metal line of the second lead-out wiring on the second inorganic insulating film.

11. The transistor substrate according to claim 4,
wherein in a second region, the first metal line of the first lead-out wiring overlaps the second metal line of the second lead-out wiring and the second metal line of the third lead-out wiring,
wherein in the first region, the second metal line of the first lead-out wiring is adjacent to the second metal line of the second lead-out wiring on the second inorganic insulating film, and
wherein in the second region, the second metal line of the third lead-out wiring is adjacent to the second metal line of the second lead-out wiring on the second inorganic insulating film.

12. The transistor substrate according to claim 11, further comprising:
  a plurality of pixels in a display region,
  wherein the first, the second, and the third lead-out wirings are located outside of the display region, and
  wherein the second region is located closer to the display region than to the first region.

* * * * *